(12) United States Patent
Lee

(10) Patent No.: US 7,906,898 B2
(45) Date of Patent: Mar. 15, 2011

(54) ORGANIC LIGHT EMITTING DEVICE WITH INCREASED LUMINESCENCE

(75) Inventor: Baek-Woon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 408 days.

(21) Appl. No.: 11/936,667

(22) Filed: Nov. 7, 2007

(65) Prior Publication Data

US 2008/0122347 A1    May 29, 2008

(30) Foreign Application Priority Data

Nov. 27, 2006 (KR) .................... 10-2006-0117558

(51) Int. Cl.
  *H01L 51/00* (2006.01)
  *H01J 9/00* (2006.01)
(52) U.S. Cl. ........................ 313/504; 313/506
(58) Field of Classification Search .............. 313/504, 313/506; 257/59, 79
  See application file for complete search history.

(56) References Cited

U.S. PATENT DOCUMENTS

| 6,689,492 | B1 * | 2/2004 | Yamazaki et al. | 428/690 |
| 2004/0017153 | A1 * | 1/2004 | Nishikawa | 313/506 |
| 2004/0183086 | A1 * | 9/2004 | Nakai | 257/98 |
| 2006/0062270 | A1 * | 3/2006 | Okutani et al. | 372/64 |
| 2006/0100704 | A1 * | 5/2006 | Blake et al. | 623/6.37 |
| 2007/0188683 | A1 * | 8/2007 | Naka | 349/114 |
| 2007/0290607 | A1 * | 12/2007 | Okada et al. | 313/504 |

* cited by examiner

*Primary Examiner* — Karabi Guharay
(74) *Attorney, Agent, or Firm* — Innovation Counsel LLP

(57) ABSTRACT

An organic light emitting device (OLED) is presented that includes: signal lines formed on a substrate; thin film transistors formed on the substrate and electrically connected to the signal lines; a first passivation layer having a concavo-convex surface; a first electrode formed on the first passivation layer; a partition formed on the first electrode and having an opening extending to the first electrode; a light emitting member formed in the opening and covered by a second electrode. The refractive indices of the light emitting member and the first passivation layer are different, and the refractive indices of the first passivation layer and the first electrode are different. The concavo-convex surface increases the luminescent surface area without decreasing the opening size, thereby enhancing the luminous power per unit pixel electrode. Forming an interface of materials whose refractive indices differ by at least 0.2 within the OLED increases light extraction efficiency.

19 Claims, 25 Drawing Sheets

ORGANIC LIGHT EMITTING DEVICE WITH INCREASED LUMINESCENCE

CROSS-REFERENCE TO RELATED APPLICATION

This application claims priority to and benefit of Korean Patent Application No. 10-2006-0117558 filed in the Korean Intellectual Property Office on Nov. 27, 2006, the entire content of which is incorporated herein by reference.

BACKGROUND OF THE INVENTION (a) Field of the Invention

The present invention relates to an organic light emitting device (OLED) and its manufacturing method.

(b) Description of the Related Art

Recently, as demand for light and thin monitors or televisions has been increasing, cathode ray tubes (CRTs) are gradually being replaced by liquid crystal displays (LCD).

While LCDs have numerous advantages over CRTs, it is not without shortcomings. For example, because an LCD is a non-emissive element, it requires a light source (usually in the form of a backlight). Furthermore, an LCD's response speed and viewing angle are not always ideal.

In search for a display device that does not share the problems LCDs have, OLED is receiving much attention.

An OLED includes pixel electrodes, a common electrode, and an emission layer positioned between the pixel electrodes and the common electrode. In the OLED, electrons injected from the common electrode and holes injected from the pixel electrodes combine in the emission layer to form excitons, and as the excitons discharge energy, the OLED generates light. Because an OLED does not require a light source, it is advantageous in terms of power consumption. Furthermore, an OLED has good response speed, viewing angle, and contrast ratio compared to LCDs.

OLEDs can be divided into passive OLEDs and active OLEDs depending on the driving method. In an active OLED, pixels are driven by using thin film transistors (TFTs) as switching elements and driving elements. An active OLED has advantages such as high resolution, low power consumption, and the possibility of a large area.

In order to enhance the luminance of an OLED and increase the luminous power per unit pixel, a method for enhancing the efficiency of a luminescent material and a method for increasing electrical current applied to each pixel electrode can be considered. However, there are practical limitations in the development of a luminescent material of high efficiency, and the method for increasing the amount of current applied to the unit pixel electrodes also has a limitation with respect to life span and efficiency of the OLED and a life span of TFTs.

SUMMARY OF THE INVENTION

The present invention has been made in an effort to provide an organic light emitting device (OLED) with increased luminous power per unit pixel electrode and its manufacturing method.

In one aspect, the present invention provides an OLED including: a substrate; a first signal line formed on the substrate; a second signal line formed perpendicularly to the first signal line; a plurality of thin film transistors (TFTs) formed on the substrate and electrically connected to the first and second signal lines; a first passivation layer formed on the TFTs and having a concavo-convex surface; a first electrode formed on the first passivation layer; a partition formed on the first electrode and having an opening extending to the first electrode; a light emitting member formed on the first electrode and in the opening; and a second electrode formed on the light emitting member. The refractive indices of the light emitting member and the first passivation layer are different, and the refractive indices of the first passivation layer and the first electrode are different.

The refractive index difference between the light emitting member and the first passivation layer and/or the refractive index difference between the first passivation layer and the first electrode is 0.2 or greater.

The first electrode may have a concavo-convex surface.

The ratio of height to bottom length of the concave/convex portion of the first electrode is between about 0.1 and about 1.

The OLED may further include a color filter formed between the substrate and the first electrode.

The OLED may further include a second passivation layer between the substrate and the first electrode.

The difference between a refractive index of the second passivation layer and that of the first passivation layer may be 0.2 or greater.

The OLED may further include a protrusion formed on the first electrode.

A difference between a refractive index of the protrusion and that of the light emitting member may be 0.2 or greater.

The protrusion may have a hemispherical shape.

The light emitting member may include a plurality of emission layers each emitting light of a different wavelength, and respective light each with a different wavelength are combined to emit white light.

In another aspect, the present invention provides an OLED including: a substrate; a first signal line formed on the substrate; a second signal line formed perpendicularly to the first signal line; a plurality of thin film transistors (TFTs) formed on the substrate and electrically connected to the first and second signal lines; a first passivation layer formed on the TFTs and having a concavo-convex surface; a first electrode formed on the first passivation layer; a partition formed on the first electrode and having an opening extending to the first electrode; a light emitting member formed on the first electrode and disposed in the opening; and a second electrode formed on the light emitting member. The ratio of height to bottom length of the concave/convex portion of the first passivation layer is between about 0.1 and about 1.

In yet another aspect, the present invention provides a method for manufacturing an OLED. The method includes: forming a plurality of signal lines and a plurality of TFTs on a substrate; forming a first passivation layer with a concavo-convex surface on the signal lines and the TFTs; forming a first electrode on the first passivation layer; forming a partition on the first electrode and having an opening extending to the first electrode; forming a light emitting member on the first electrode in the opening; and forming a second electrode on the light emitting member.

The concavo-convex shape of the surface of the first passivation layer may be formed at a portion corresponding to the opening.

The ratio of height to bottom length of the concave/convex portion of the first passivation layer may be between about 0.1 and about 1.

The forming of the first passivation layer may include coating a photosensitive organic layer, exposing the photosensitive organic layer to light through a slit mask, and developing the photosensitive organic layer.

The method for manufacturing the OLED may further include forming a color filter between the substrate and the first electrode.

The method for manufacturing the OLED may further include forming a second passivation layer between the substrate and the first electrode.

The method for manufacturing the OLED may further include forming a protrusion on the first electrode.

A difference between a refractive index of the protrusion and that of the light emitting member may be 0.2 or greater.

The protrusion may have a hemispherical shape.

DETAILED DESCRIPTION OF THE EMBODIMENTS

Figure 1:
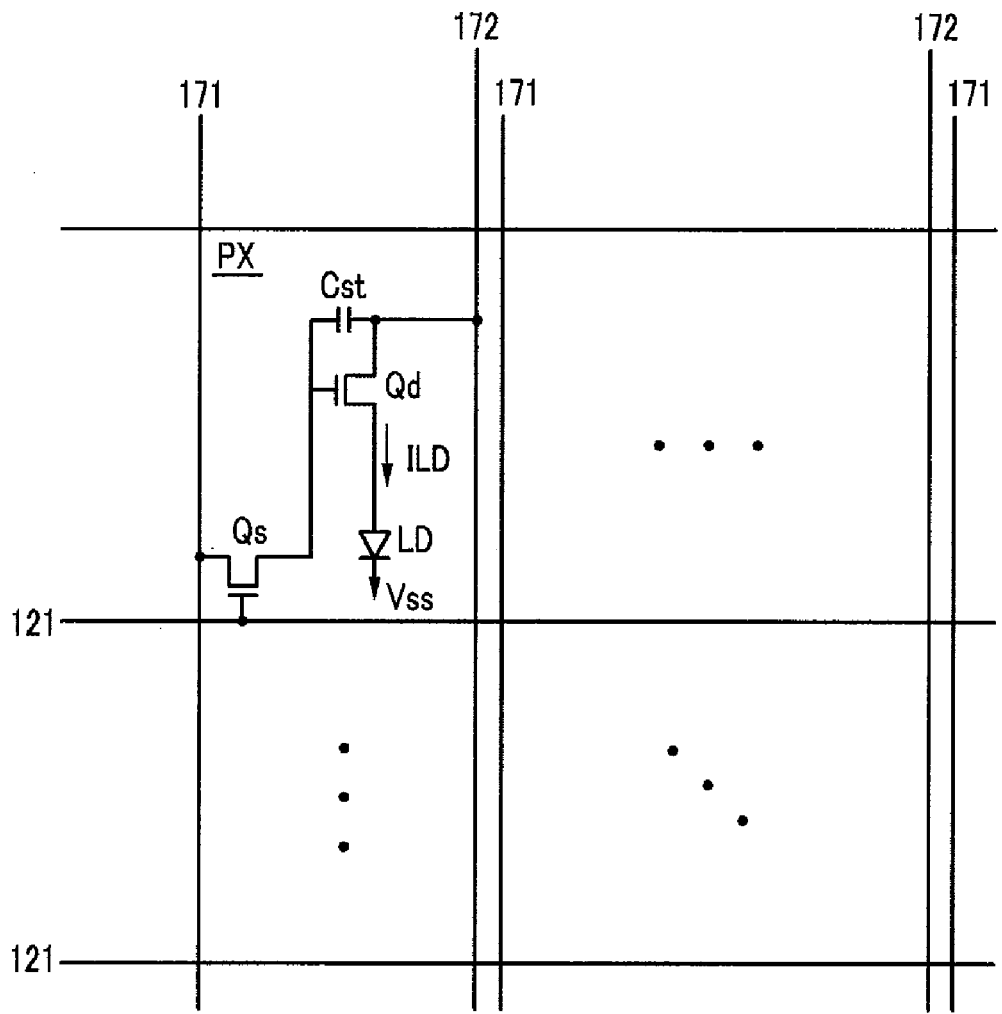
FIG. 1 is an equivalent circuit diagram of an organic light emitting device (OLED) according to one exemplary embodiment of the present invention.

The present invention will be described more fully hereinafter with reference to the accompanying drawings, in which exemplary embodiments of the invention are shown. As those skilled in the art would realize, the described embodiments may be modified in different ways without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "connected to" another element, it can be directly connected to the other element or intervening elements may be present. In contrast, when an element is referred to as being "directly connected to" another element, there are no intervening elements present.

The organic light emitting device (OLED) according to respective exemplary embodiments of the present invention is a bottom emission type OLED.

First, an OLED according to one exemplary embodiment of the present invention will be described in detail with reference to FIG. 1.

FIG. 1 is an equivalent circuit diagram of an organic light emitting device (OLED) according to one exemplary embodiment of the present invention.

With reference to FIG. 1, the OLED according to the present exemplary embodiment includes a plurality of signal lines ("signal lines" collectively refers to gate lines 121, data lines 171, and driving voltage lines 172), and a plurality of pixels connected to the signal lines and arranged substantially in a matrix form.

The signal lines include a plurality of gate lines 121 that transfer gate signals (or scan signals), a plurality of data lines 171 that transfer data signals, and a plurality of driving voltage lines 172 that transfer driving voltages. The gate lines 121 extend substantially in a first direction and substantially parallel to each other, and the data lines 171 and the driving voltage lines 172 extend substantially in a second direction and substantially parallel to each other.

Each pixel PX includes a switching transistor Qs, a driving transistor Qd, a storage capacitor Cst, and an organic light emitting diode LD.

The switching transistor Qs includes a control terminal, an input terminal, and an output terminal, whereby the control terminal is connected to the gate line 121, the input terminal is connected to the data line 171, and the output terminal is connected to the driving transistor Qd. The switching transistor Qs transfers a data signal applied to the data line 171 to the driving transistor Qd in response to a scan signal applied to the gate line 121.

The driving transistor Qd also includes a control terminal, an input terminal, and an output terminal. The control terminal is connected to the switching transistor Qs, the input terminal is connected to the driving voltage line 172, and the output terminal is connected to the organic light emitting diode LD. The driving transistor Qd outputs an output current ILD with a size that varies depending on a voltage applied between the control terminal and the output terminal.

The capacitor Cst is connected between the control terminal and the input terminal of the driving transistor Qd. The capacitor Cst charges a data signal applied to the control terminal of the driving transistor Qd and maintains it even after the switching transistor Qs is turned off.

The organic light emitting diode LD includes an anode connected to the output terminal of the driving transistor Qd and a cathode connected to common voltage Vss. The organic light emitting diode LD is illuminated with an intensity that changes according to the output current ILD of the driving transistor Qd to display an image.

The switching transistor Qs and the driving transistor Qd are n-channel electric field effect transistors (FETs). Also, in this case, at least one of the switching transistor Qs and the driving transistor Qd can be a p-channel FET. The connection relationship between the transistors Qs and Qd, the capacitor Cst, and the organic light emitting diode LD may change.

The detailed structure of the OLED will now be described with reference to FIGS. 1 to 4.

Figure 2:
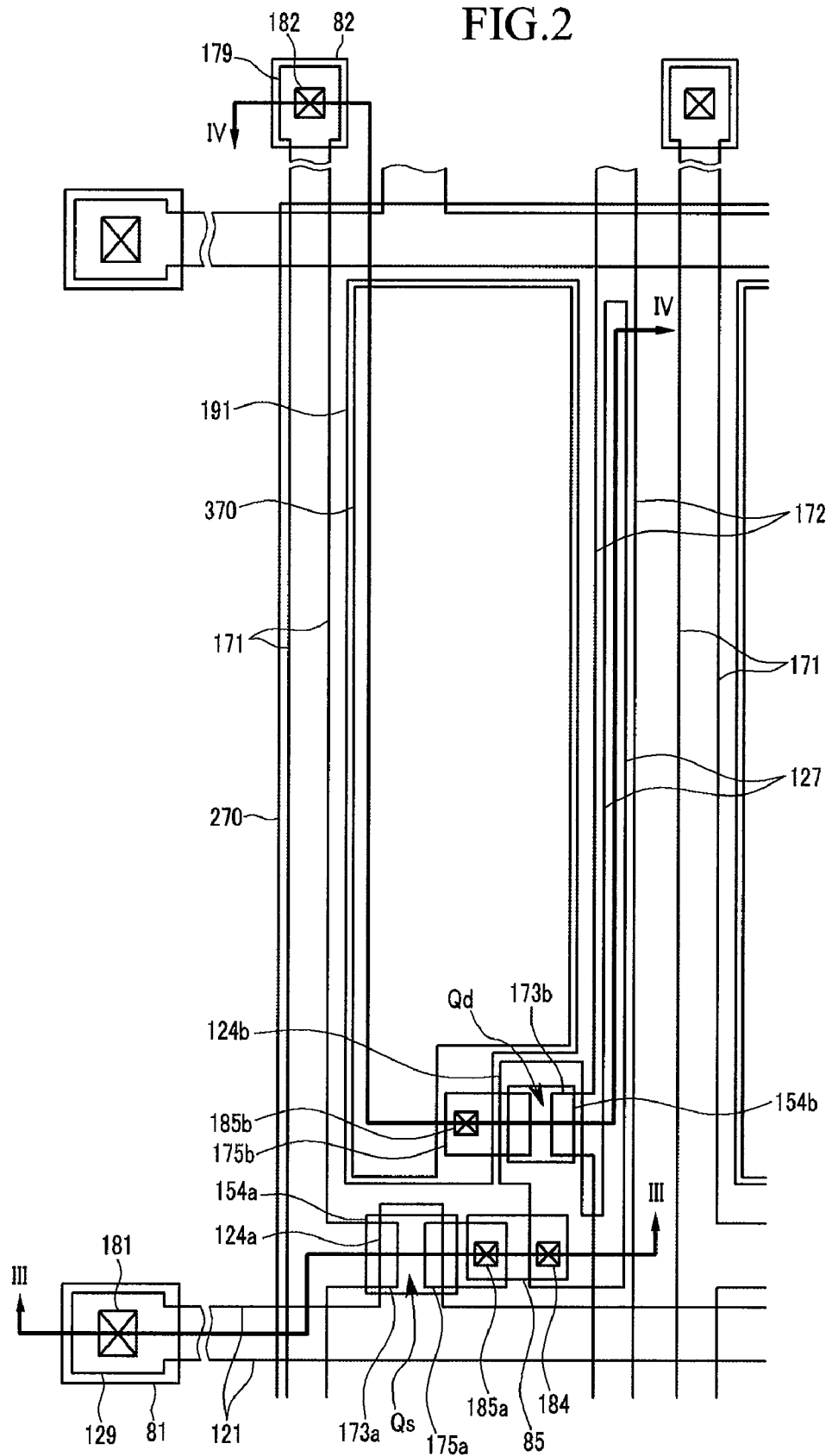
FIG. 2 is a layout view of the OLED according to one exemplary embodiment of the present invention.
Figure 3:
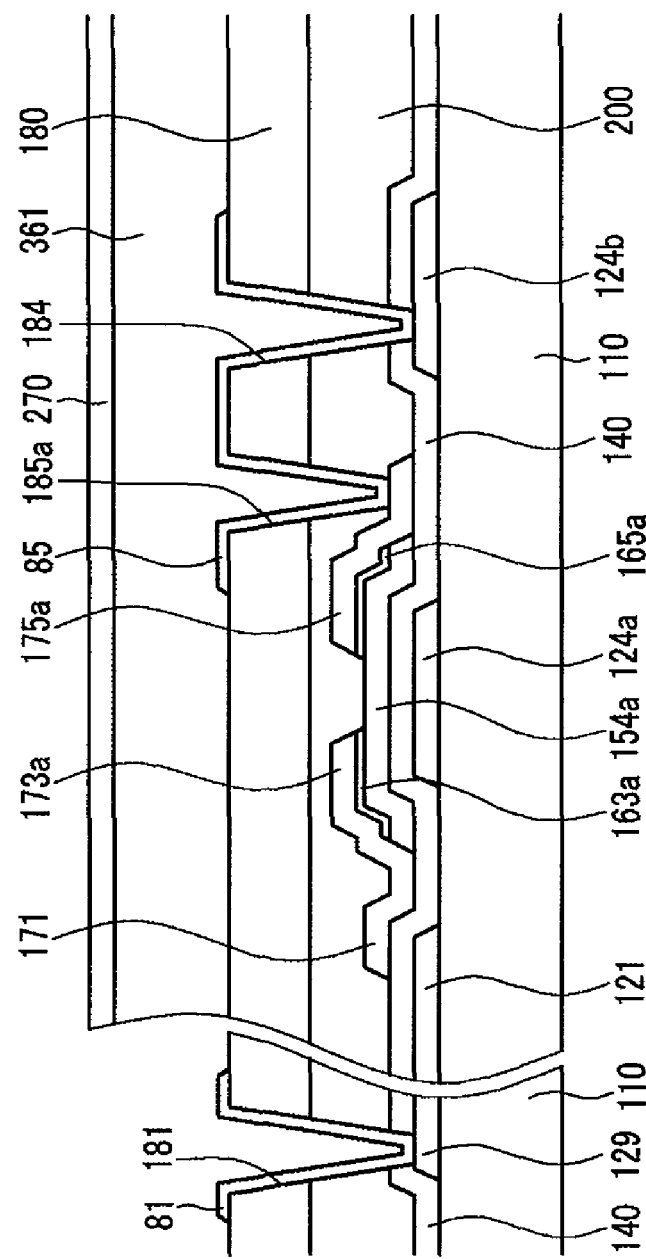
FIGS. 3 and 4 are cross-sectional views taken along the lines III-III and IV-IV, respectively, of the OLED of FIG. 2.
Figure 4:
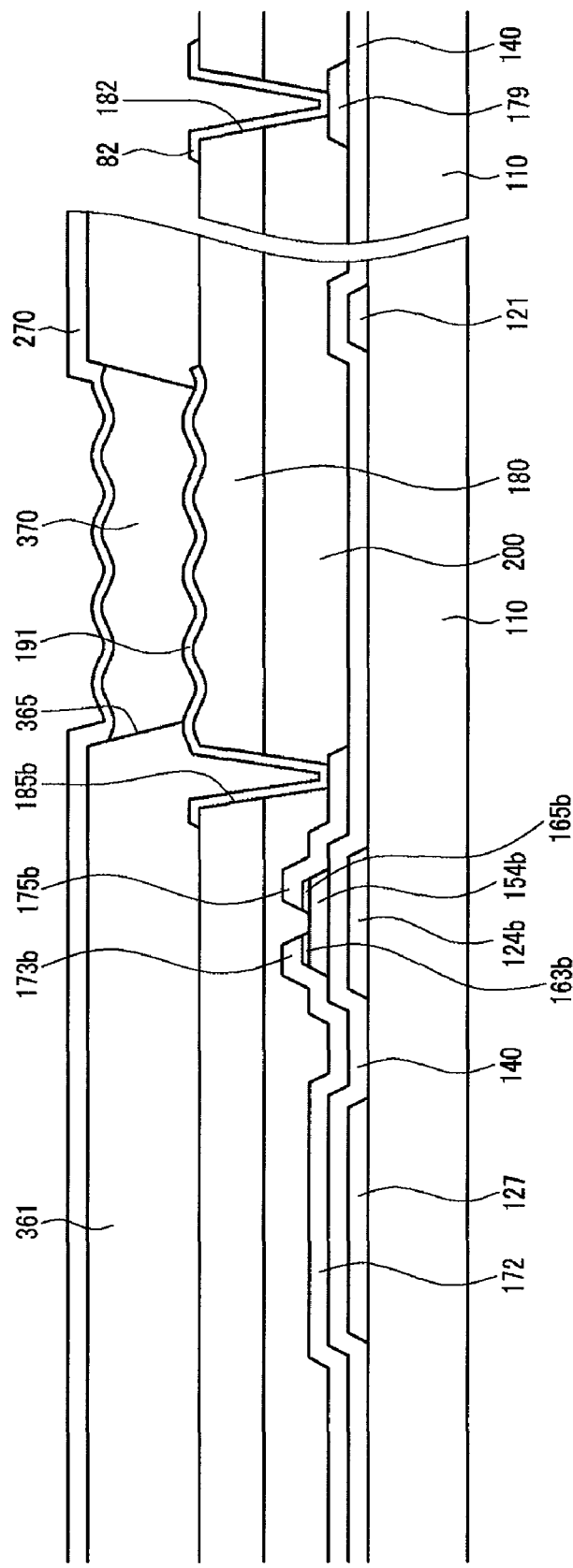

FIG. 2 is a layout view of the OLED according to one exemplary embodiment of the present invention, and FIGS. 3 and 4 are cross-sectional views taken along the lines III-III and IV-IV, respectively, of the OLED of FIG. 2.

A plurality of gate lines 121 including a first control electrode 124a and a plurality of gate conductors including a plurality of second control electrodes 124b are formed on an insulation substrate 110.

The insulation substrate 110 includes a display area and a non-display area at an outer edge of the display area, and is made of transparent glass, plastic, etc.

The gate lines 121 transfer gate signals and extend substantially in the first direction. Each gate line 121 includes a large end portion 129 for connection with a different layer or an external driving circuit, and the first control electrode 124a extends from the gate line 121 upward (with respect to FIG. 2). When a gate driving circuit (not shown) that generates gate signals is integrated with the insulation substrate 110, the gate lines 121 may be elongated to directly connect to the gate driving circuit.

The second control electrode 124b is separated from the gate lines 121 and includes storage electrodes 127 formed to extend in a downward direction (with respect to FIG. 2), bending, and extending upward (with respect to FIG. 2).

The gate conductors 121, 124a, and 124b can be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc. Also, the gate conductors 121 and 124b can have a multi-layered structure including two conductive layers (not shown) each having different physical properties.

The sides of the gate conductors 121, 124a, and 124b are sloped to the surface of the insulation substrate 110, and preferably, the slope angle is within the range of about 30° to 80°.

A gate insulating layer 140 made of silicon nitride or silicon oxide, etc., is formed on the gate conductors 121, 124a, and 124b.

A plurality of first and second semiconductors 154a and 154b made of hydrogenated amorphous silicon (a-Si) or polycrystalline silicon, etc., are formed on the gate insulating layer 140. The first semiconductor 154a is positioned on the first control electrode 124a and the second semiconductor 154b is positioned on the second control electrode 124b.

A pair of first ohmic contacts 163a and 165a and a pair of second ohmic contacts 163b and 165b are formed on the first and second semiconductors 154a and 154b, respectively. The ohmic contacts 163a, 163b, 165a, and 165b have an island shape, and can be made of a material such as n+ hydrogenated amorphous silicon in which n-type impurities such as phosphorus are doped with a high density, or of silicide.

A plurality of data conductors including the plurality of data lines 171, the plurality of driving voltage lines 172, and the plurality of first and second output electrodes 175a and 175b are formed on the ohmic contacts 163a, 163b, 165a, and 165b, and on the gate insulating layer 140.

The data lines 171 transfer data signals and extend substantially in the second direction perpendicularly to the gate lines. Each data line 171 includes a plurality of first input electrodes 173a extending toward the first control electrodes 124a, and the large end portion 179 for a connection with a different layer or an external driving circuit. When a data driving circuit (not shown) that generates data signals is integrated with the insulation substrate 110, the data lines 171 can be elongated to directly connect to the data driving circuit.

The driving voltage lines 172 transfer driving voltages and extend substantially in the vertical direction to cross the gate lines 121. Each driving voltage line 172 includes a plurality of second input electrodes 173b extending toward the second control electrodes 124b. The driving voltage lines 172 overlap with storage electrodes 127.

The first and second output electrodes 175a and 175b are separated from each other and are also separated from the data lines 171 and the driving voltage lines 172. The first input electrode 173a and the first output electrode 175a are positioned across the first control electrode 124a from each other, and the second input electrodes 173b and the second output electrode 175b are positioned across the second control electrode 124b from each other.

The data conductors 171, 172, 175a, and 175b are preferably made of a refractory metal such as molybdenum, chromium, tantalum, titanium, etc., or their alloys, and may have a multi-layered structure including the refractory metal layer (not shown) and a low-resistance conductive layer (not shown).

Like the gate conductors 121, 124a, and 124b, the sides of the data conductors 171, 172, 175a, and 175b are also preferably sloped to the surface of the insulation substrate 110 to form an angle of about 30° to 80°.

Color filters 200 are formed on the data conductors 171, 172, 175a, and 175b, on the exposed portions of the semiconductors 154a and 154b, and on the gate insulating film 140. The color filters 200 are not formed on the end portion 129 of the gate line 121 connected to an external circuit and the end portion 179 of the data line 171, and edges of the color filters 200 overlap on extending portions 123 of the data line 171, the data line 121 or the driving voltage line 172. By forming the color filters 200 such that their edges overlap, light leakage from the area between the pixels can be blocked.

In the OLED according to the exemplary embodiment of the present invention, a red pixel for displaying a red color, a green pixel for displaying a green color, a blue pixel for displaying a blue color, and a white pixel for not displaying a color can be alternately disposed. For example, the four pixels including the red, green, blue, and white pixels can be formed in a single group and be repeated in a line, and the disposition of the pixels can be variably modified.

In this case, the red, green, and blue pixels include red, green, and blue filters, respectively. The white pixel typically does not include a color filter and may include a white transparent filter.

An interlayer insulating layer (not shown) can be formed at the lower portion of the color filters 200. The interlayer insulating layer can prevent pigments of the color filters 200 from being introduced to the semiconductor.

A passivation layer 180 is formed on the color filters 200. The passivation layer 180 is made of an inorganic insulator or an organic insulator, and has a concavo-convex surface. The inorganic insulator can be, for example, silicon nitride (SiNx) and silicon oxide ($SiO_2$), and the organic insulator can be, for example, a poly acryl-based compound or a poly carbonate-based compound. The passivation layer 180 may have a dual-layer structure including an inorganic film and an organic film.

A plurality of contact holes 182, 185a, and 185b exposing the end portion 179 of the data line 171 and the first and second output electrodes 175a, 175b, respectively, are formed through the passivation layer 180. A plurality of contact holes 181 and 184 exposing the end portion 129 of the gate line 121 and the second input electrodes 124b, respectively, are formed through the passivation layer 180 and the gate insulating layer 140.

A plurality of pixel electrodes 191 made of a transparent conductive material such as ITO (indium tin oxide) or IZO (indium zinc oxide), a plurality connecting members 85, and a plurality of contact assistants 81 and 82 are formed on the passivation layer 180.

The pixel electrode 191 is physically and electrically connected to the second output electrodes 175b via the contact hole 185b, and is formed to have a concavo-convex structure on an uneven surface of the passivation layer 180.

In the case where the pixel electrode 191 has the concavo-convex surface, its surface area increases, enlarging the luminescent area. Accordingly, compared with a planar structure, the luminescent area can be increased while maintaining the same aperture ratio.

In order to help describe this, examples will be described with reference to FIGS. 17 and 19.

Figure 17:
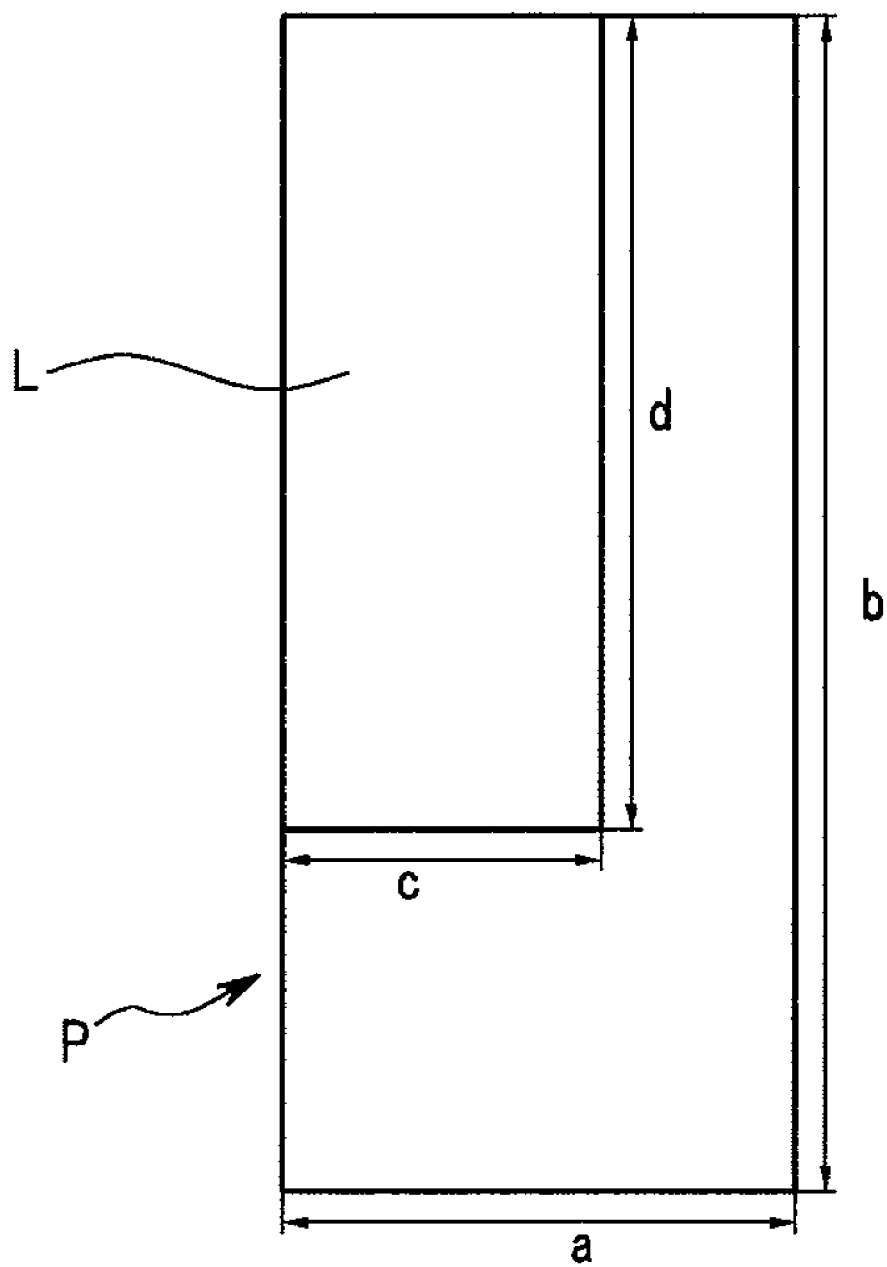
FIG. 17 is a schematic diagram showing a pixel electrode with a planar surface.
Figure 18:
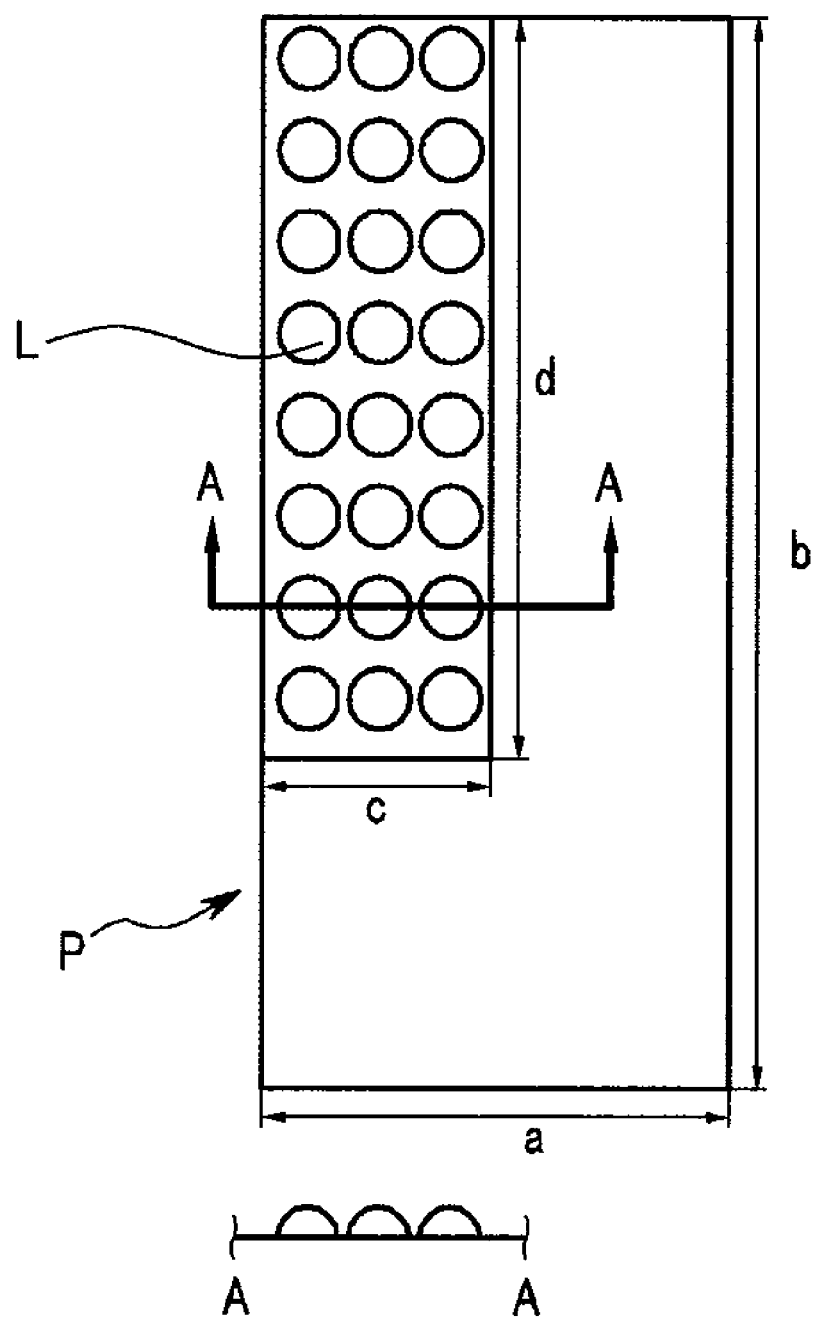
FIG. 18 is a schematic diagram showing a pixel electrode with an embossed surface.
Figure 19:
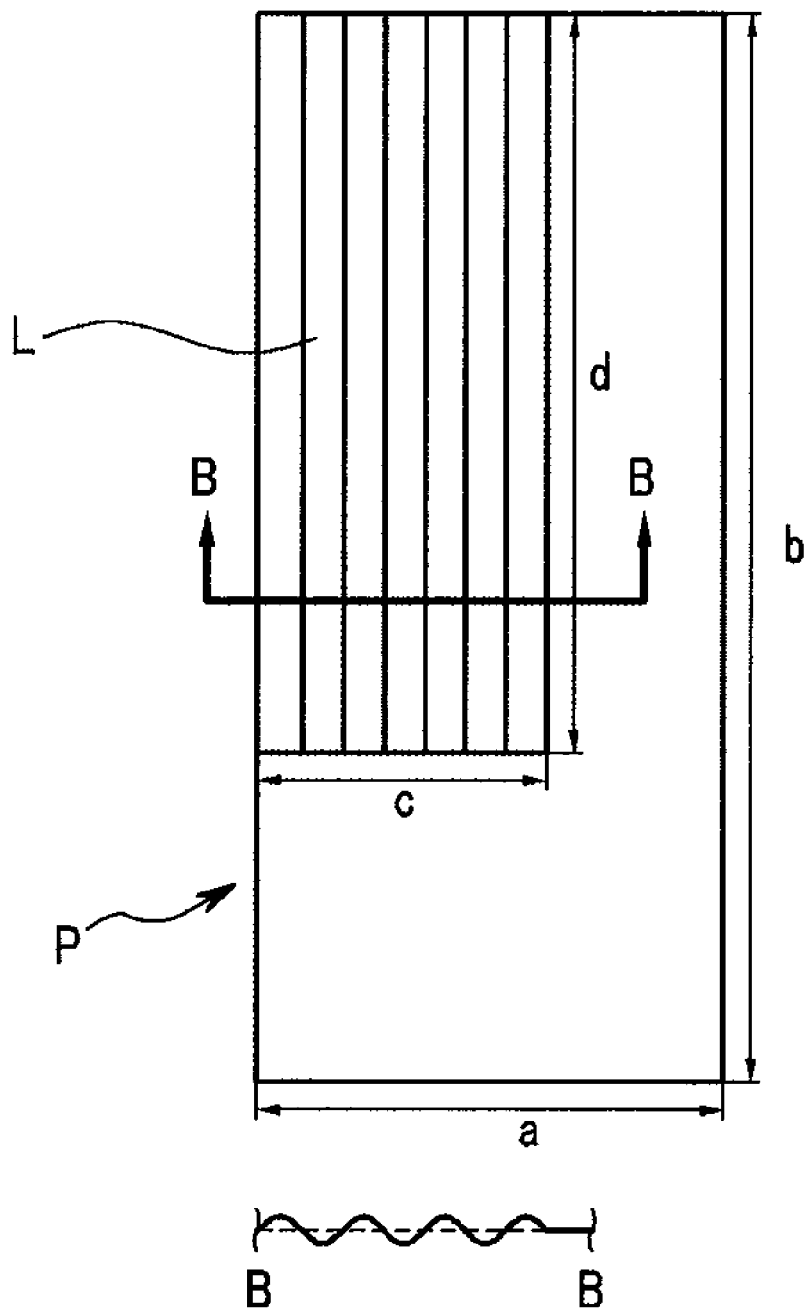
FIG. 19 is a schematic diagram showing a pixel electrode with a slate-structured surface.

FIG. 17 is a schematic diagram showing a pixel electrode with a planar surface, FIG. 18 is a schematic diagram showing a pixel electrode with an embossed surface, and FIG. 19 is a schematic diagram showing a pixel electrode with a slate-structured surface.

In FIGS. 17 to 19, "P" indicates a unit pixel and "L" indicates a luminescent region of the unit pixel. Here, the unit pixel has an area of a×b, and the luminescent region has an area of c×d. For clarity of illustration, it is assumed that a, b, c, and d are 100, 300, 60, and 200, respectively, hereinbelow. With reference to FIG. 17, when the pixel electrode 191 has a planar surface (namely, when a single pixel has an area of 100×300=30,000 and the luminescent region thereof has an area of 60×200=12,000), the luminescent area has the same size as that of the luminescent region, and the luminescent region accounts for 40% of the pixels (12,000/30,000).

With reference to FIG. 18, when the pixel electrode 191 has the embossed surface and if it is assumed that a radius (r) of the embossed balls formed within the luminescent region (L) of the same unit pixel (P) is 10, a total of 30 embossed balls can be formed. In this case, an outer width of the hemisphere is $200\pi$ ($2\pi r^2$), and the actual surface area is $30\times(400-10^2\pi+200\pi)=12,000+3,000\pi$. Thus, compared with the pixel electrode having a planar surface, the luminescent area of the pixel electrode with the embossed surface increases by about $3000\pi$, so the rate of the luminescent region of the pixel increases up to about 71% ($(12,000+3000\pi)/30,000\approx71\%$).

Likewise, with reference to FIG. 19, when the pixel electrode 191 has a slate structure (that is, a wavy surface), and if it is assumed that a semicircular cylinder (a cylinder cut along its longest axis) with a radius (r) of 5 alternately overlaps up and down (that is, wavily), the circumference of the semicircle (r) is 5 (and a total of 12 semicircles can be formed), so the total surface area of the slate is $12\times5\pi\times200=600\pi$. Thus, the rate of the luminescent region of the pixel is $12,000\pi/30,000=125.6\%$.

Although only the embossing type and the slate type of pixel electrodes have been described as examples, these particular types of pixel electrodes are not limitations of the invention and any structure with various concavo-convex forms that increase the surface area can be applied to the pixel electrode to obtain the same results.

With the concavo-convex structure, the pixel electrode 191 can have the increased luminescent surface area than a planar structure with the same opening area.

The structure of the OLED will now be described in view of the refractive index rather than the luminescent area.

In general, the structure of a conventional OLED is such that a surface between an anode and the light emitting device and that between the pixel electrode and the passivation layer are parallel to each other. That structure, however, has a problem in that light generated at a threshold angle or larger is totally internally reflected and do not leave the surface between the pixel electrode and the passivation layer.

However, by introducing the concavo-convex structure and including an interface having a refractive index difference of 0.2 or larger in the structure of the OLED, the parallel state can be agitated to change the reflection angle of the light generated at the threshold angle or larger while passing through total reflection, thus increasing the light extracting efficiency of the OLED.

The refractive index of a general organic light emitting element is about 1.8, so a material to be used to form the first passivation layer 180 in the exemplary embodiment of the present invention preferably has a refractive index of 1.6 or less. Accordingly, two or more optical interfaces are included to change the reflection angles formed between the common electrode 270 and an organic light emitting member 370, between the organic light emitting member 370 and the first passivation layer 180, and between the color filters 200 and the substrate 110. Preferably, a ratio of height to a bottom length of the concave portion or the convex portion of the first passivation layer 180 is greater than 0.1 but smaller than 1. As used herein, "bottom length" refers to the length of a section of the concave portion or convex portion of a reference surface based on which the height of the concave/convex portion is calculated. For example, when the convex portion or the concave portion has a hemispherical shape the "bottom length" usually refers to the diameter of a sphere. When the convex portion or the concave portion has a semicircular cylindrical shape, it refers to the diameter of a circle.

The connecting member 85 is connected to the second control electrode 124b and the first output electrode 175a via the contact holes 184 and 185a.

The contact assistants 81 and 82 are connected to the end portion 129 of the gate line 121 and the end portion 179 of the data line 171 via the contact holes 181 and 182, respectively. The contact assistants 81 and 82 complement adhesion of the end portion 129 of the gate line 121 and the end portion 179 of the data line 171 with an external device, and protect them.

A partition 361 is formed on the first passivation layer 180. The partition 361 defines an opening 365 by surrounding an edge of the pixel electrode 191. The partition can be made of an organic insulator with heat resistance and solvent resistance such as an acrylic resin or a polyimide resin, etc., or an inorganic insulator such as silicon oxide ($SiO_2$) or titanium dioxide ($TiO_2$), etc., and can be formed as a double layer or more. The partition 361 can be made of a photosensitive material including a black pigment, and in this case, the partition 361 serves as a light blocking member and its formation process is simple.

The organic light emitting member 370 is formed in the opening 365 on the pixel electrode 191.

The organic light emitting member 370 includes a plurality of emission layers (not shown) that emit lights of various wavelengths, and lights of different wavelengths are combined to emit white light. The organic light emitting member 370 may have a multi-layered structure including an auxiliary layer (not shown) in order to improve luminous efficiency of the emission layers, in addition to the emission layers that emit light.

The emission layers are formed by stacking an organic material that has one or more of the primary colors such as the red, green, and blue, or a mixture of an organic material or an inorganic material, and may include a polyfluorene derivative, a (poly)paraphenylenevinylene derivative, a polyphenylene derivative, a polyfluorene derivative, or a polyvinylcarbazole or polythiophene derivative, or a compound obtained by doping a perylene-based coloring matter, a cumarine-based coloring matter, a rhodamine-based coloring matter, rubrene, perylene, 9,10-diphenylanthracene, tetraphenylbutadiene, Nile red, coumarin, quinacridone, etc.

However, in an OLED in which light emitted by the emission layer is directly used to display colors without using color filters, the emission layer can be formed of a single layer made of an organic material that emits light of one of three primary colors of red, green, and blue, or a mixture of an organic material and an inorganic material.

The auxiliary layer may be an electron transport layer (not shown) and a hole transport layer (not shown) for balancing electrons and holes, a hole transport layer, and an electron injecting layer (not shown) and a hole injecting layer (not shown) for strengthening the injection of electrons and holes. In some embodiments, the auxiliary layer may include multiple layers selected from these options. The hole transport layer and the hole injecting layer are made of a material having a work function of an average level of the common electrode 270 and the emission layers. For example, the hole transport layer or the hole injecting layer can be made of a mixture (poly-(3,4-ethylenedioxythiophene:polystyrenesulfonate, PEDOT:PSS)), etc.

The common electrode 270 made of an alloy of aluminum, magnesium, or silver, opaque metals, or an alloy of calcium or silver, and is formed on the organic light emitting member 370. The common electrode 270 is formed on the entire surface of the insulation substrate 110, and it outputs an electric current to the organic light emitting member 370 together with the pixel electrodes 191, as pairs.

The common electrode 270 can be made of an opaque conductive material that has good electron injection and does not react with the organic material. For example, it may be made of an aluminum-based metal or barium (Ba), etc. In the case of a top-emission-type OLED, the common electrode 270 can be made of a transparent conductive material such as ITO or IZO or a translucent conductive material, and can be formed as a single layer made of aluminum (Al) or silver (Ag) with a thickness of about 50 Å to 100 Å, or as a multi-layer made of Ca—Ag, LiF—Al, Ca—Ba, Ca—Ag-ITO, etc. Also, in the case of the top-emission-type OLED, the color filters 200 are disposed on the common electrode 270.

In the OLED, the first control electrode 124a connected to the gate line 121, the first input electrode 173a connected to the data line 171, and the first output electrode 175a connected to the first input electrode 173a form the switching TFT Qs together with the first semiconductor 154a, and a channel of the switching TFT Qs is formed at the first semiconductor 154a between the first input electrode 173a and the first output electrode 175a. The second control electrode 124b connected to the first output electrode 175a, the second input electrode 173b connected to the driving voltage line 172, and the second output electrode 175b connected to the pixel electrode 191 form the driving TFT Qd together with the second semiconductor 154b, and a channel of the driving TFT Qd is formed at the second semiconductor 154b between the second input electrode 173b and the second output electrode 175b.

In the present exemplary embodiment, only the single switching TFT Qs and the single driving TFT Qd are illustrated. However, in other embodiments, at least one TFT and a plurality of lines for driving it can be additionally included to prevent or compensate for the degradation of the organic light emitting diode LD or the driving transistor Qd from a long driving time. This way, undesirable shortening of the life span of the OLED is prevented.

The pixel electrode 191, the organic light emitting member 370, and the common electrode 270 form the organic light emitting diode LD, and in this case, the pixel electrode 191 may become an anode and the common electrode 270 may become a cathode, or the pixel electrode 191 may become the cathode and the common electrode 270 may become the anode. The storage electrode 127 and the driving voltage line 172, which overlap with each other, form the storage capacitor Cst.

When the semiconductors 154a and 154b are made of polycrystalline silicon, they include an intrinsic region (not shown) on the control electrode 124a and extrinsic regions (not shown) positioned at both sides of the intrinsic region. The extrinsic regions are electrically connected to the input electrodes 173a and 173b and the output electrodes 175a and 175b, and the ohmic contacts 163a, 163b, 165a, and 165b can be omitted.

The control electrodes 124a and 124b can be positioned on the semiconductors 154a and 154b. In this case, the gate insulating layer 140 extends between the semiconductors 154a and 154b and the control electrodes 124a and 124b. The data conductors 171, 172, 173b, and 175b can be positioned on the gate insulating layer 140 and electrically connected to the semiconductors 154a and 154b via contact holes (not shown) formed at the gate insulating layer 140. Alternatively, the data conductors 171, 172, 173b, and 175b can be positioned below the semiconductors 154a and 154b and electrically contact the semiconductors 154a and 154b.

The manufacturing method of the OLED according to the exemplary embodiment of the present invention will now be described in detail with reference to FIGS. 5 to 16.

Figure 5:
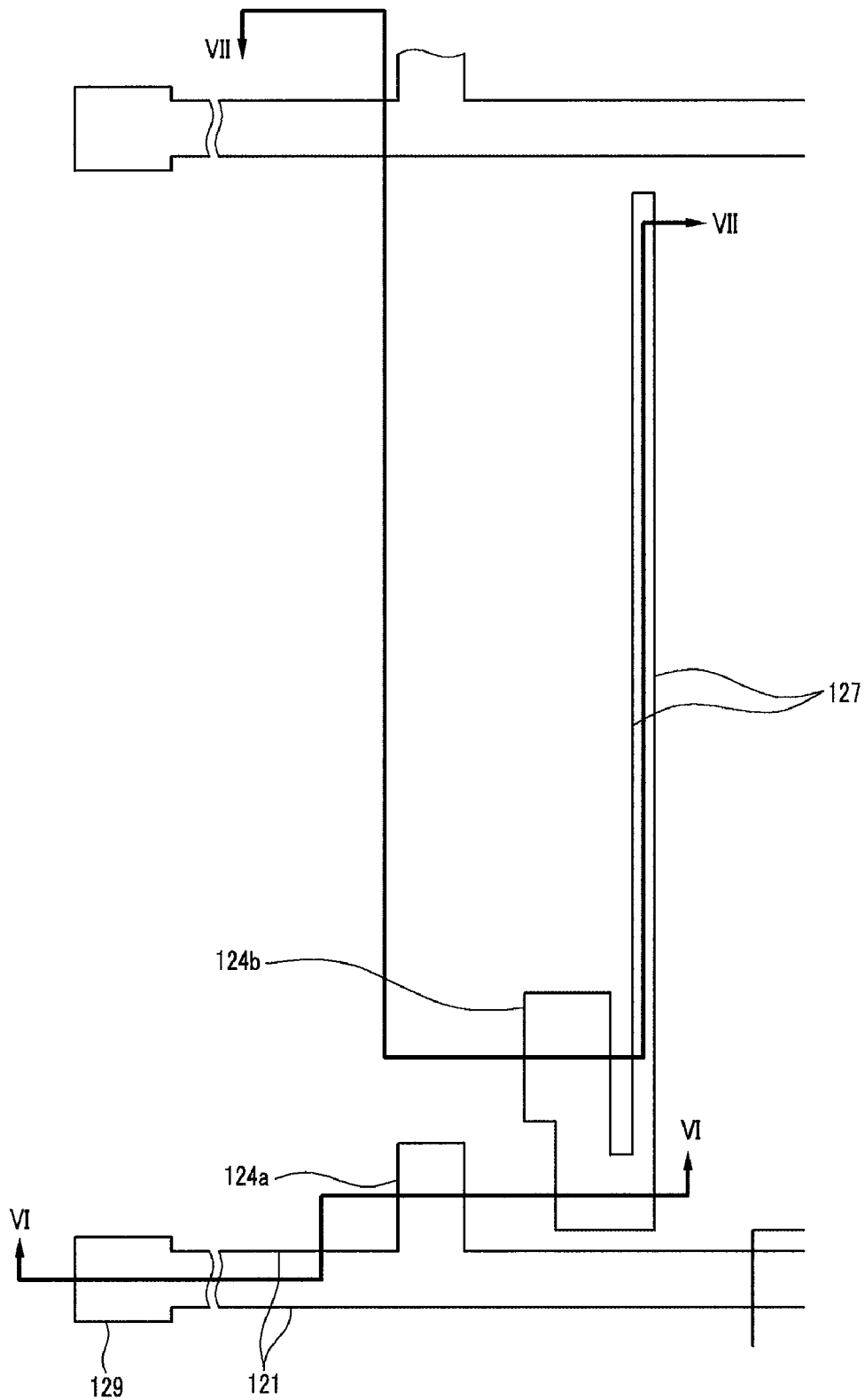
FIGS. 5, 8, 11, and 14 are layout views sequentially showing a method of manufacturing the OLED according to one exemplary embodiment of the present invention.
Figure 6:
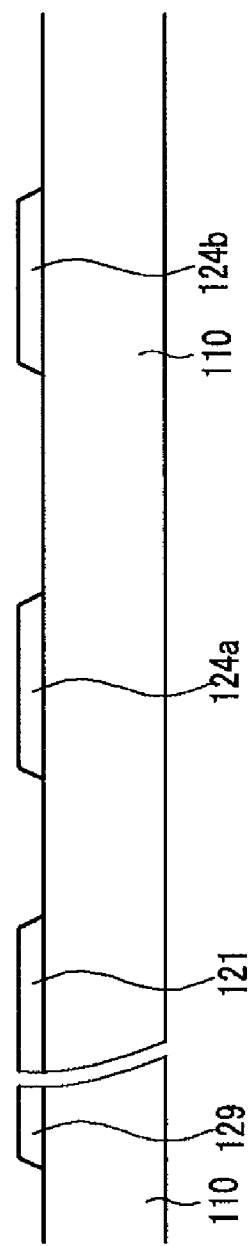
FIGS. 6 and 7 are cross-sectional views taken along the lines VI-VI and VII-VII of the OLED of FIG. 5.
Figure 7:
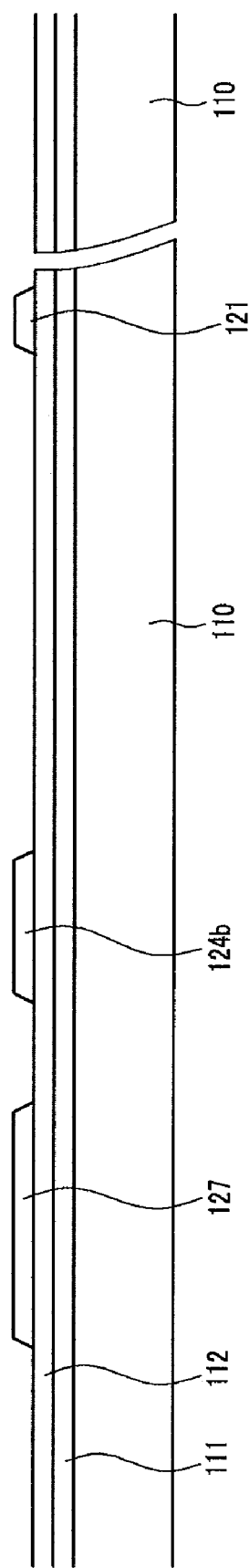
Figure 8:
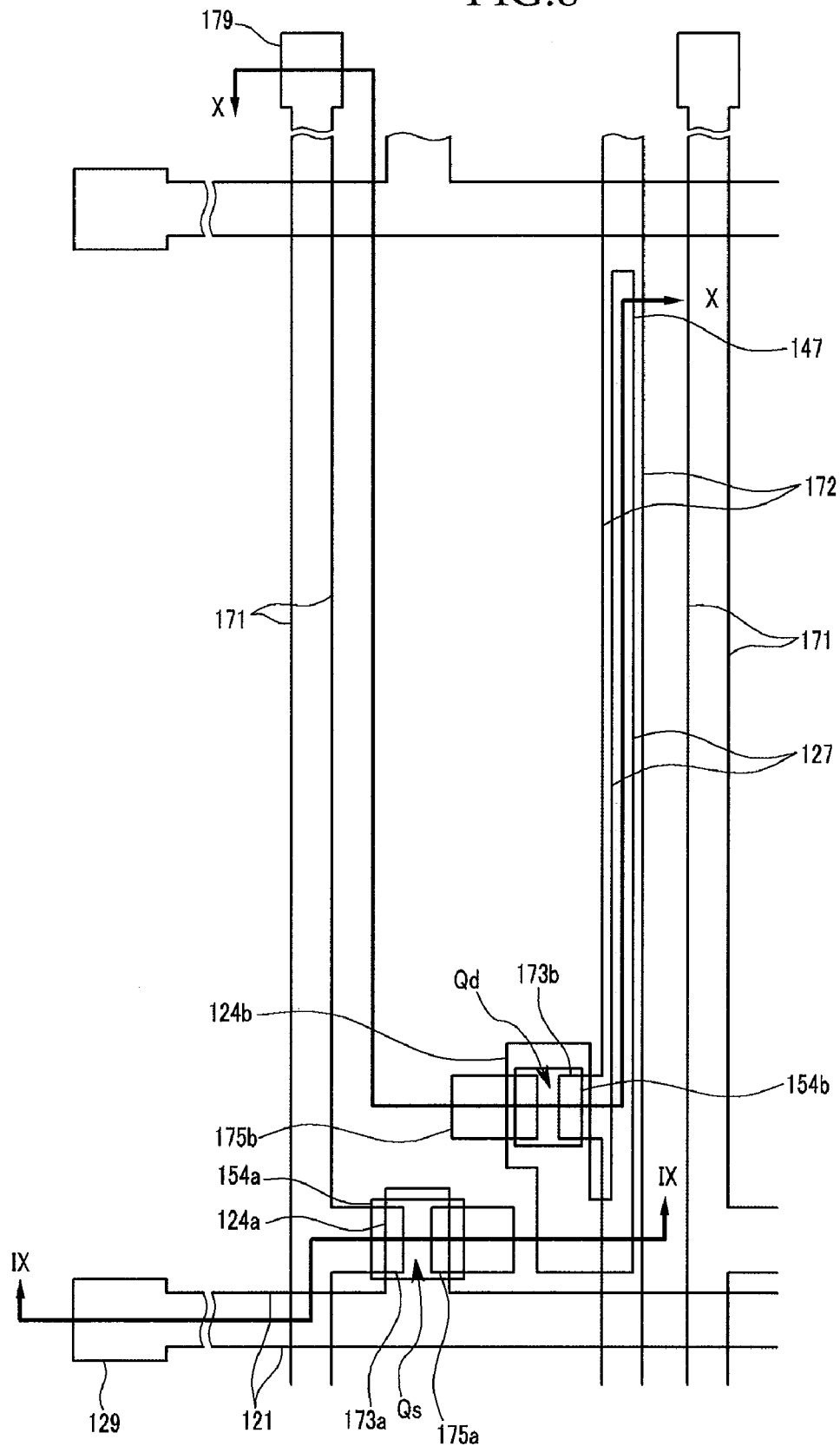
Figure 9:
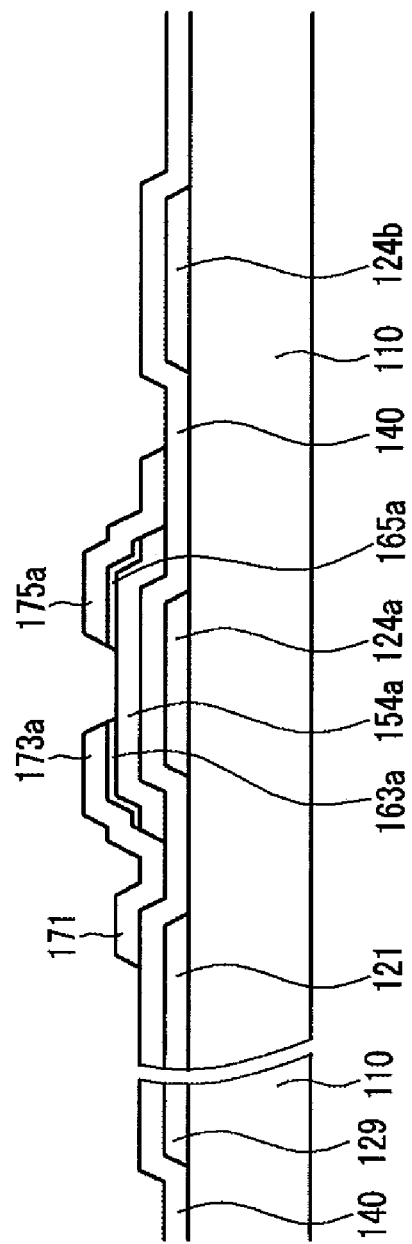
FIGS. 9 and 10 are cross-sectional views taken along the lines IX-IX and X-X, respectively, of the OLED of FIG. 8.
Figure 10:
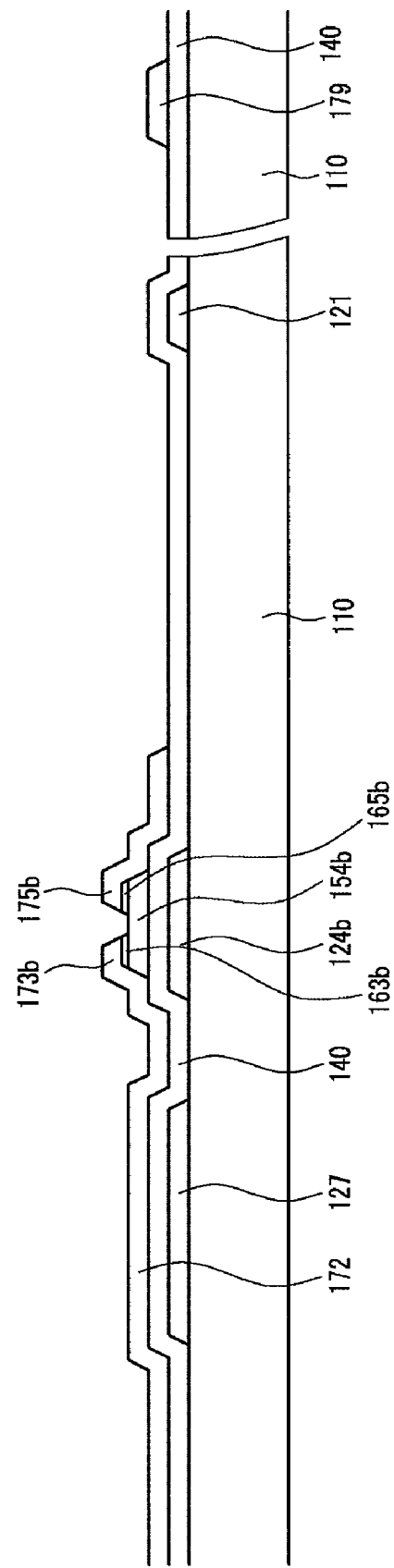
Figure 11:
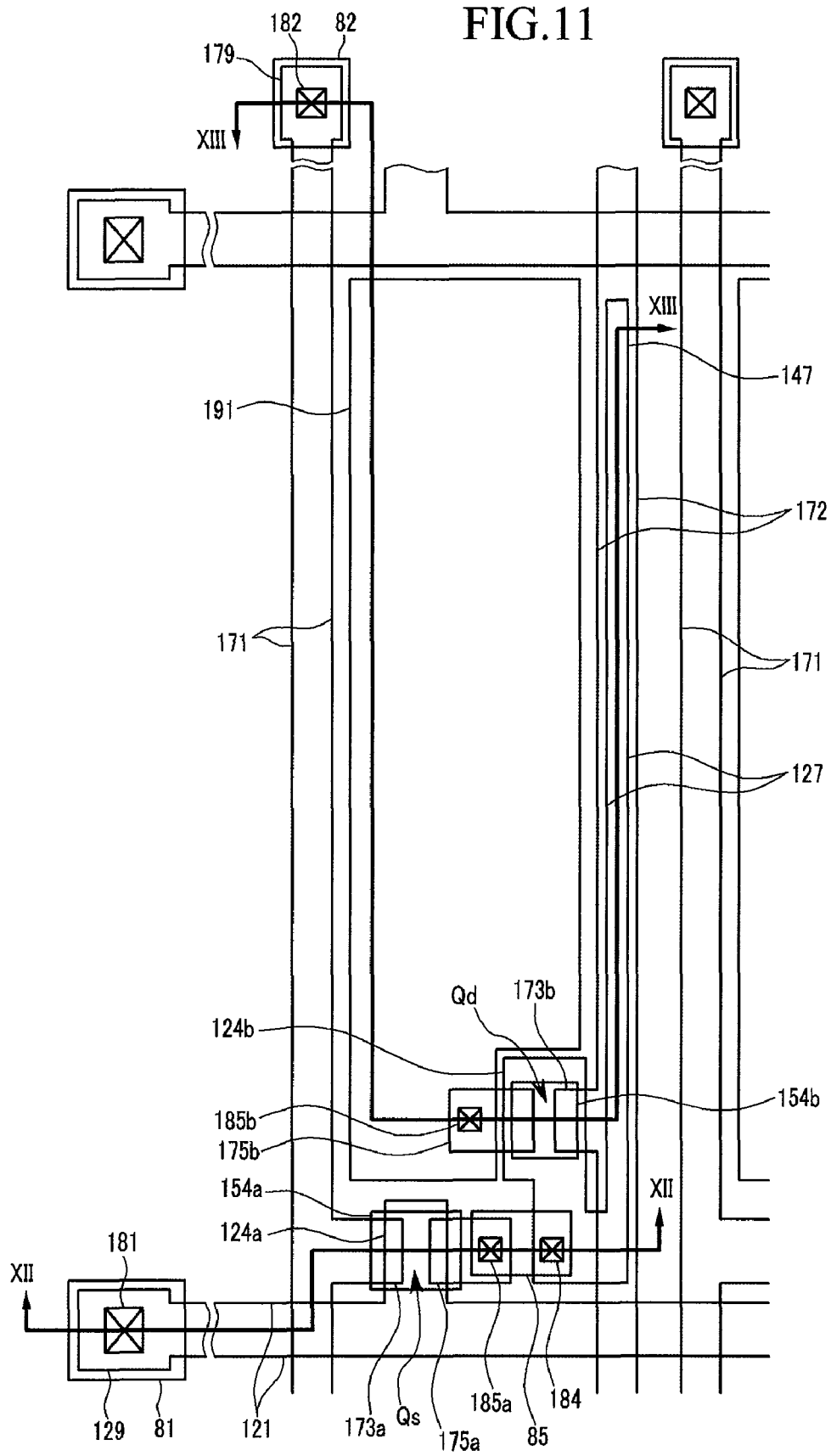
Figure 12:
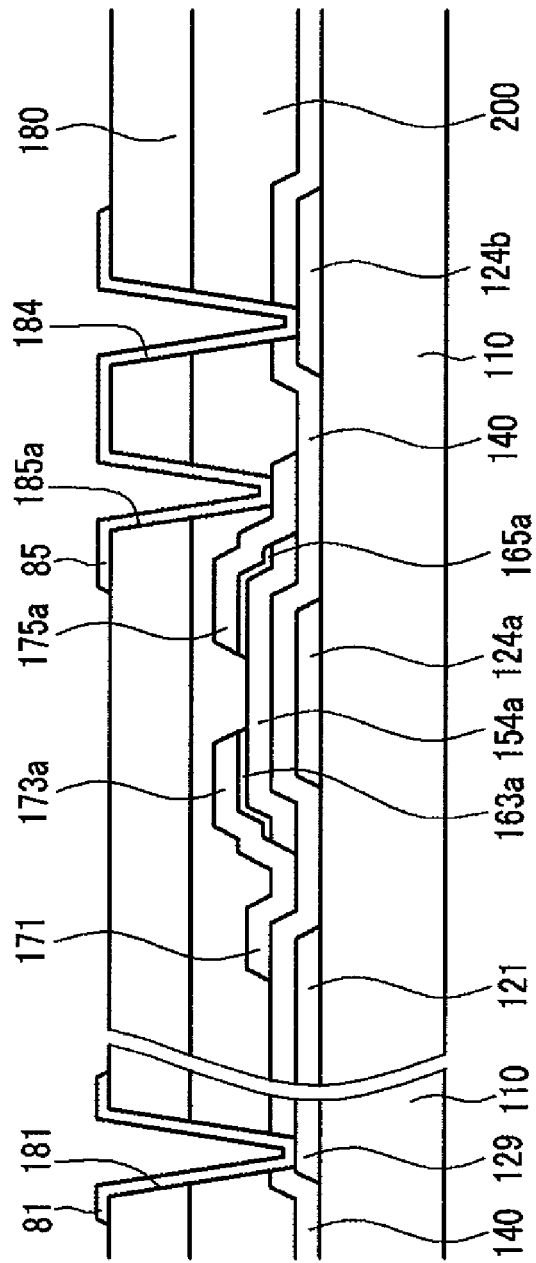
FIGS. 12 and 13 are cross-sectional views taken along the lines XII-XII and XIII-XIII, respectively, of the OLED of FIG. 11.
Figure 13:
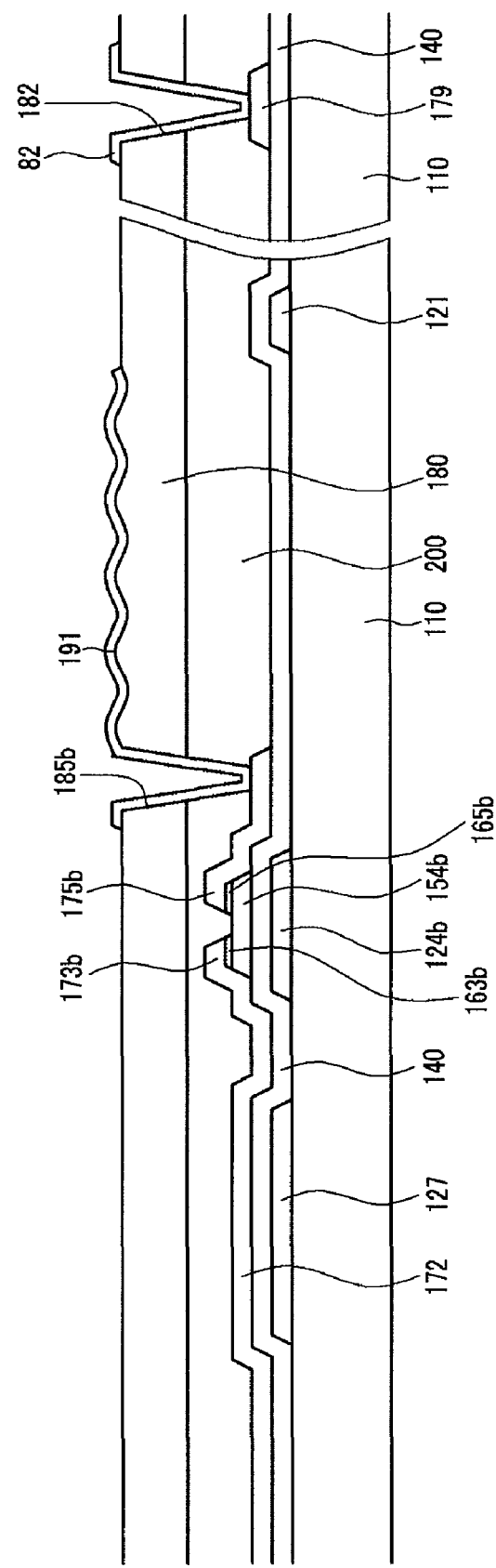
Figure 14:
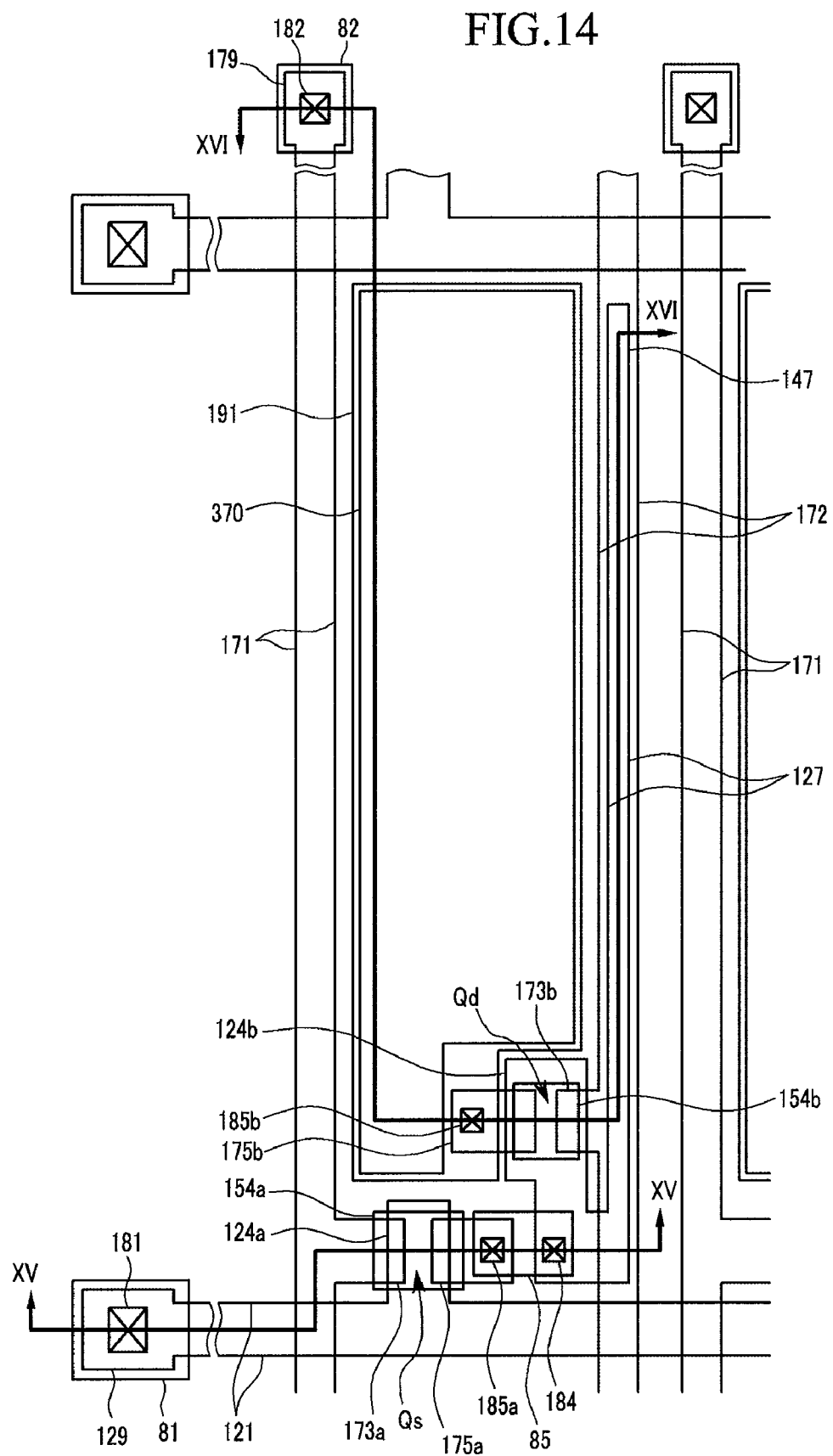
Figure 15:
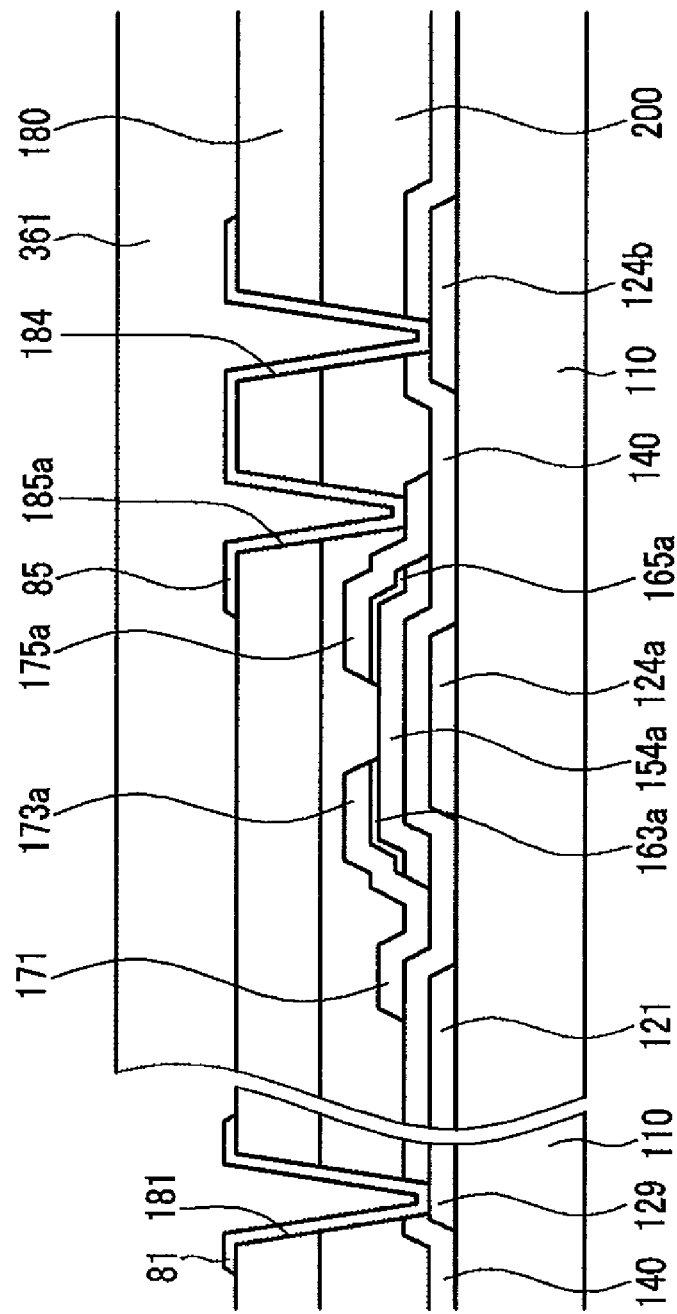
FIGS. 15 and 16 are cross-sectional views taken along the lines XV-XV and XVI-XVI, respectively, of the OLED of FIG. 14.
Figure 16:
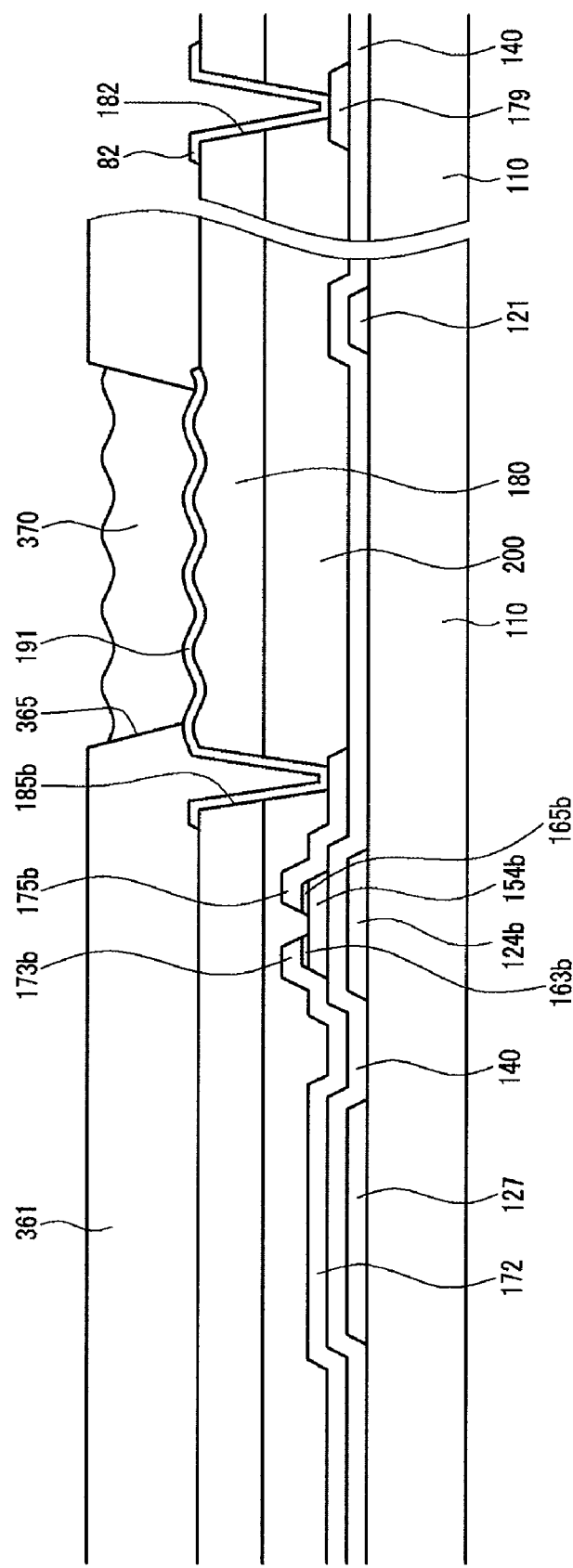

FIGS. 5, 8, 11, and 14 are layout views sequentially showing a method for manufacturing the OLED according to one exemplary embodiment of the present invention, FIGS. 6 and 7 are cross-sectional views taken along the lines VI-VI and VII-VII of the OLED of FIG. 5, FIGS. 9 and 10 are cross-sectional views taken along the lines IX-IX and X-X, respectively, of the OLED of FIG. 8, FIGS. 12 and 13 are cross-sectional views taken along the lines XII-XII and XIII-XIII, respectively, of the OLED of FIG. 11, and FIGS. 15 and 16 are cross-sectional views taken along the lines XV-XV and XVI-XVI, respectively, of the OLED of FIG. 14.

First, as shown in FIGS. 5 to 7, the gate conductors, which are made of aluminum alloy and include the gate lines 121 including the first control electrode 124a and the end portion 129 and the second control electrodes 124b including the storage electrode 127, are formed on the transparent insulation substrate 110.

Next, as shown in FIGS. 8 to 10, triple layers of the gate insulating layer 140, the intrinsic amorphous silicon layer, and an impurity amorphous silicon layer are successively stacked, and then the impurity amorphous silicon layer and the intrinsic amorphous silicon layer are processed through photolithography to form a plurality of first and second impurity semiconductors (not shown) and the first and second semiconductors 154a and 154b.

Subsequently, the data conductors, which are made of aluminum alloy and include the data lines 171 including the first input electrode 173a and the end portion 179 and the driving voltage line 172 including the second input electrode 173b, and the plurality of first and second output electrodes 175a and 175b, are formed.

Thereafter, an impurity semiconductor portion that is not covered by the data conductors 171, 172, 175a, and 175b is removed to complete the ohmic contacts 163a, 165a, 163b, and 165b and expose a portion of the first and second semiconductors 154a and 154b.

Then, as shown in FIGS. 11 to 13, the color filters 200 are formed on the data line 171, a connecting electrode 176, the auxiliary driving voltage member 172, and the substrate 110. As for the color filters 200, a red filter is formed in a red pixel, a green filter is formed in a green pixel, and a blue filter is formed in a blue pixel. No color filter is formed in a white pixel. If desired, a transparent insulating layer can be formed in the white pixel.

Thereafter, the first passivation layer 180, as the photosensitive organic layer, is stacked on the color filters 200 through a chemical vapor deposition or a printing method and processed by photolithography to form the plurality of contact holes 181, 182, 184, 185a, and 185b, and then a portion of the first passivation layer 180 positioned under the organic light emitting member 370 is patterned. The contact holes 181, 182, 184, 185a, and 185b expose the end portions 129 of the gate lines 121, the end portions 179 of the data lines 171, the second control electrodes 124b, the first output electrodes 175a, and the second output electrodes 175b. The patterned first passivation layer 180 is then hardened.

In this case, the amount of light exposure should be sufficient so that the contact holes 181, 182, 184, 185a, and 185b can be completely bored, and in addition, it is preferred for the concavo-convex portion to be formed on the first passivation layer 180 to have a gentle slope face so as to be advantageous in depositing the organic light emitting member 370, so the amount of light exposure should be smaller than the case of forming the contact holes 181, 182, 184, 185a, and 185b. Accordingly, in the manufacturing process, the concavo-convex portion and the contact holes 181, 182, 184, 185a, and 185b can be simultaneously formed by using a slit mask. As a matter of course, a mask for the contact holes 181, 182, 184, 185a, and 185b and a mask for the concavo-convex portion can be separately fabricated and exposed to different amounts of light to be manufactured. In this case, the order may change.

Then, ITO is deposited on the patterned portion of the first passivation layer 180 and the non-patterned portion of the first passivation layer 180. The non-patterned portion of the first passivation layer 180 is then patterned to form the plurality of pixel electrodes 191, the plurality of connecting members 85, and the plurality of contact assistants 81 and 82.

Next, as shown in FIGS. 14 to 16, the photosensitive organic insulator is deposited by spin coating, and then exposed and developed to form the partitions 361 having the openings 365 on the pixel electrodes 191.

Subsequently, the organic light emitting members 370 including the hole transport layer (not shown) and the emission layer (not shown) are formed in the openings 365 on the pixel electrodes 191. The organic light emitting member 370 can be formed through a solution process such as an inkjet printing method or a deposition method. Among them, the inkjet printing method in which a solution is injected into the openings 365 while moving an inkjet head (not shown) is preferable. If the inkjet pring method id used, the respective layers are dried after being formed.

Thereafter, as shown in FIGS. 2 to 4, aluminum is deposited on the partitions 361 and the organic light emitting members 370 through a sputtering method, to form the common electrode 270.

Alternatively, instead of employing the concavo-convex structure presented in the present exemplary embodiment, other types of concavo-convex structures, such as a method in which the passivation layer is etched to have imprints and the pixel electrode is formed thereon, can be formed.

An OLED according to another exemplary embodiment of the present invention will now be described with reference to FIG. 20, mainly based on its difference from the OLED according to the former exemplary embodiment of the present invention as shown in FIG. 4.

Figure 20:
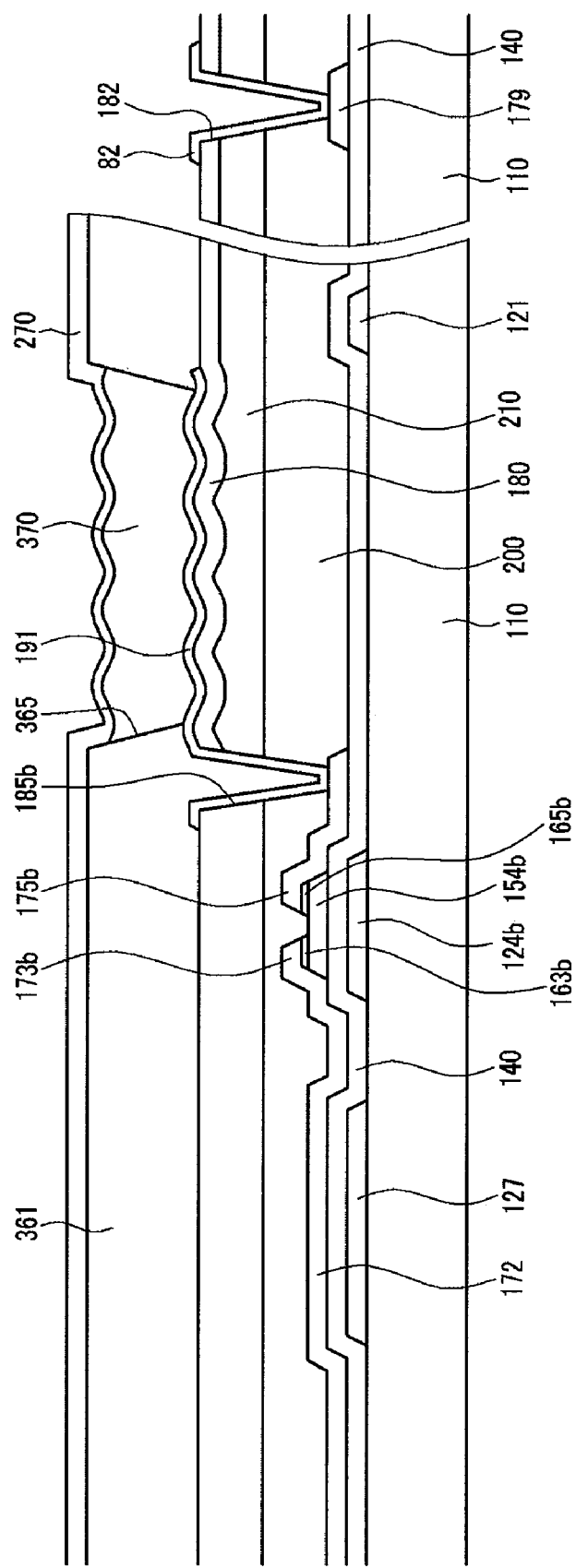
FIG. 20 is a cross-sectional view taken along the line IV-IV of the OLED of FIG. 2 according to another exemplary embodiment of the present invention.

FIG. 20 is a cross-sectional view taken along the line IV-IV of the OLED in FIG. 2 according to another exemplary embodiment of the present invention.

The present exemplary embodiment has a structure in which a second passivation layer 210 is included between the substrate 110 and the pixel electrode 191. The second passivation layer 210 is patterned. Accordingly, a concavo-convex shape can be generated by coating a uniform thickness of the first passivation layer 180 on the second passivation layer 210. The second passivation layer 210 can be made of a polycarbonate-based compound containing silicon nitride (SiNx) with a refractive index of about 1.8, or a high refractive index additive. Accordingly, an additional optical interface can be formed between the first passivation layer 180 and the second passivation layer 120 with the refractive index of about 1.8 to change the reflection angle and increase the optical extraction efficiency of the light emitting device.

An OLED according to yet another exemplary embodiment of the present invention will now be described with reference to FIG. 21. The embodiment of FIG. 21 will be described with a focus on its difference from the exemplary embodiment of FIG. 20.

Figure 21:
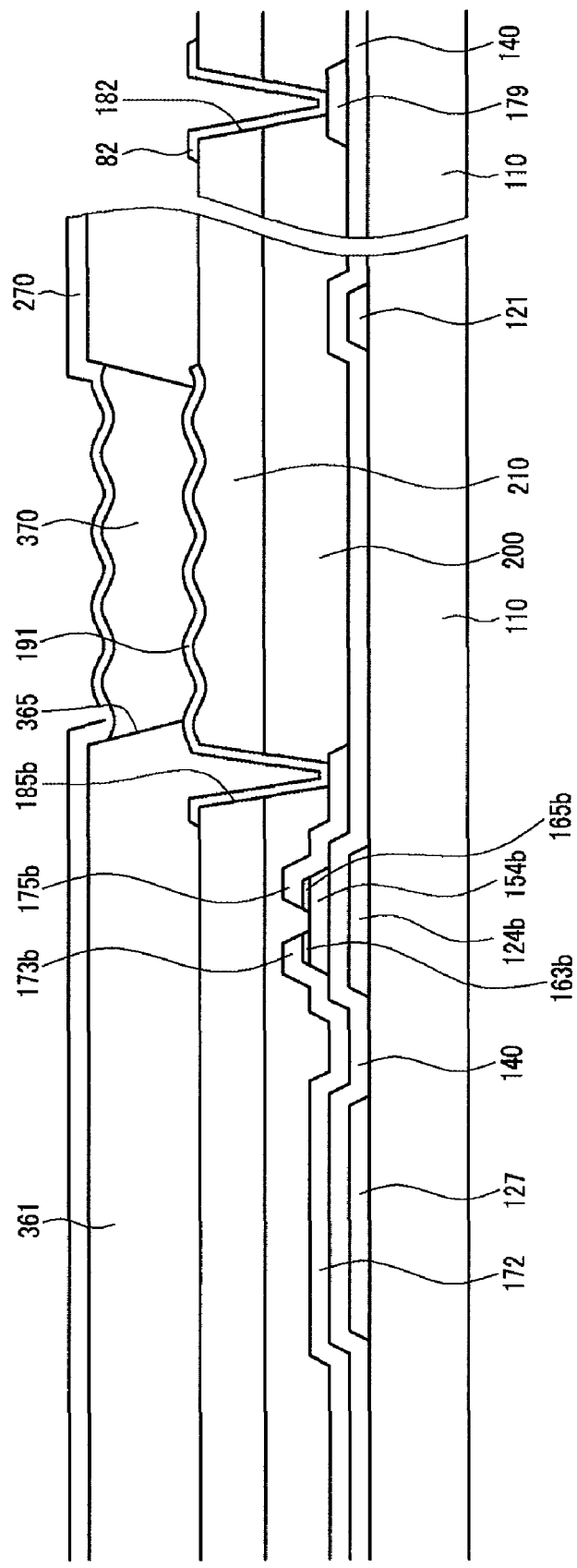
FIG. 21 is a cross-sectional view taken along the line IV-IV of the OLED of FIG. 2 according to yet another exemplary embodiment of the present invention.

FIG. 21 is a cross-sectional view taken along the line IV-IV of the OLED in FIG. 2 according to yet another exemplary embodiment of the present invention.

In the present exemplary embodiment, only the second passivation layer 210, instead of both the first and second passivation layers 180 and 210, is formed under the pixel electrode 191. The second passivation layer 210 can be made of a polycarbonate-based compound containing silicon nitride (SiNx) with a refractive index of about 1.8, or a high refractive index additive. Thus, a concavo-convex shape can be formed by patterning the second passivation layer 210 and simply coating the pixel electrode 191. Accordingly, an additional optical interface can be formed between the common electrode 270 and the organic light emitting member 370 and between the second passivation layer 210 and the substrate 110 to change the reflection angle and thus increase the optical extraction efficiency of the light emitting device.

An OLED according to yet another exemplary embodiment of the present invention will now be described with reference to FIG. 22. The embodiment of FIG. 22 will be described with a focus on its difference from the exemplary embodiment of FIG. 20.

Figure 22:
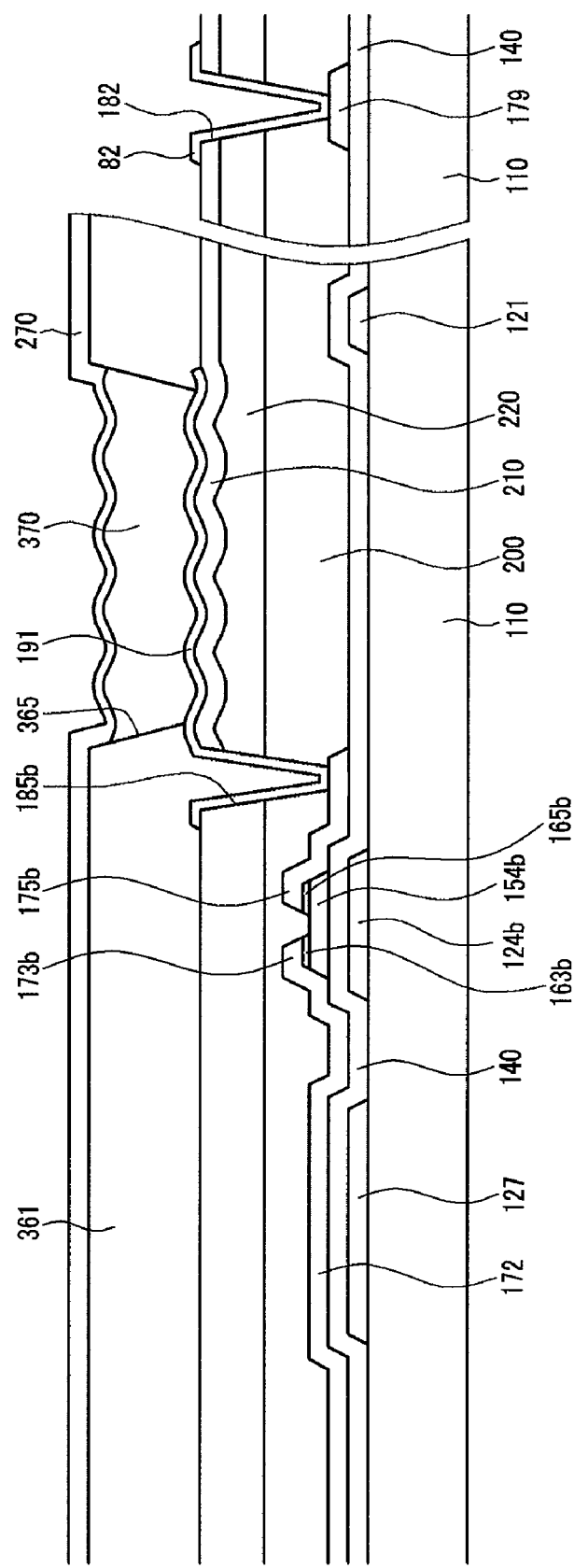
FIG. 22 is a cross-sectional view taken along the line IV-IV of the OLED of FIG. 2 according to yet another exemplary embodiment of the present invention.

FIG. 22 is a cross-sectional view taken along the line IV-IV of the OLED in FIG. 2 according to yet another exemplary embodiment of the present invention.

In the present exemplary embodiment, the second passivation layer 210 and a third passivation layer 220 are used as the lower layers of the pixel electrode 191. The second passivation layer 210 can be made of a polycarbonate-based compound containing silicon nitride (SiNx) with a refractive index of about 1.8 or a high refractive index additive, and the third passivation layer 220 formed under the second passivation layer 210 can be made of a polycarbonate-based compound containing silicon oxide (SiOx) with a refractive index of about 1.5 or a low refractive index additive. A concavo-convex shape can be generated by patterning the third passivation layer 220 and coating a uniform thickness of the second passivation layer 210 and the pixel electrode 191. Accordingly, an additional optical interface can be formed between the common electrode 270 and the organic light emitting member 370 and between the second passivation layer 210 and the third passivation layer 220 to change the angle of reflection, thus increasing the optical extraction efficiency of the light emitting device.

Although not shown, in the above-described structure, the second passivation layer 210 can be formed to be sufficiently thick. In such a structure, the second passivation layer 210 can be less affected by the patterned third passivation layer 220. Thus, the second passivation layer 210 can be formed to be smoother than in the former embodiment. In this case, because the layers of the overall OLED become uniformly thick overall, some layers with the OLED having the concavo-convex portion become partially thin or thick to concentrate an electric current in one portion. When the electric current is concentrated in one portion, a probability of generating a short circuit increases at the portion where the electric current is concentrated, lowering reliability.

An OLED according to a different exemplary embodiment of the present invention will now be described with reference to FIG. 23. The embodiment of FIG. 23 will be described with a focus on its difference from the exemplary embodiment of FIG. 20.

Figure 23:
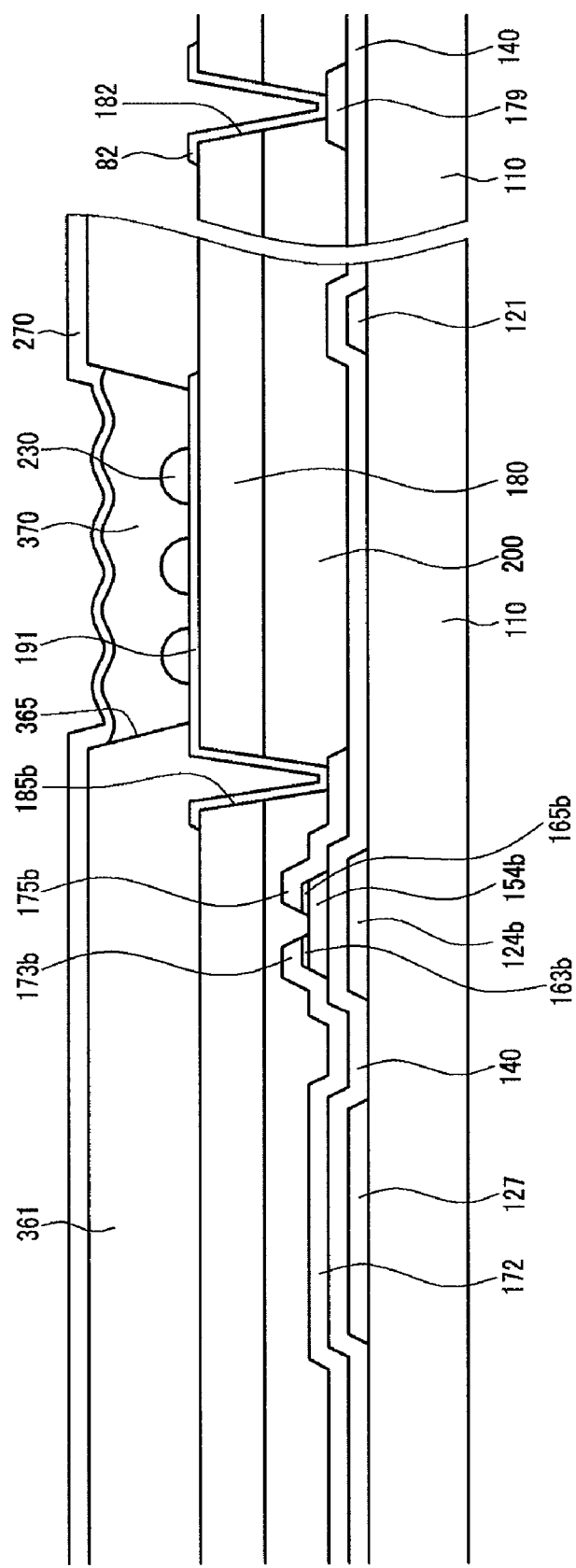
FIG. 23 is a cross-sectional view taken along the line IV-IV of the OLED of FIG. 2 according to a different exemplary embodiment of the present invention.

FIG. 23 is a cross-sectional view taken along the line IV-IV of the OLED in FIG. 2 according to a different exemplary embodiment of the present invention.

In the present exemplary embodiment, the pixel electrode 191 includes protrusions 230. Because the protrusions 230 are disposed on the pixel electrode 191 within the organic light emitting member 370, the concavo-convex shape is generated on the surface of the organic light emitting member 370 to increase the light extraction efficiency of the light emitting device. A refractive index of the protrusions 230 is different by 0.2 or more than that of the organic light emitting member 370. In the present exemplary embodiment, the layers from the substrate 110 up to the pixel electrode 191 are formed to be flat while the protrusions 230 are formed to be hemispherical. Accordingly, the organic light emitting member 370 formed on the hemispherical protrusions 230 can have the concavo-convex shape. By coating a uniform thickness of the common electrode 270 on the organic light emitting member 370, the common electrode 270 can have the concavo-convex shape.

An OLED according to yet a different exemplary embodiment of the present invention will now be described with reference to FIG. 24. The embodiment of FIG. 24 will be described with a focus on its difference from the exemplary embodiment of FIG. 23.

Figure 24:
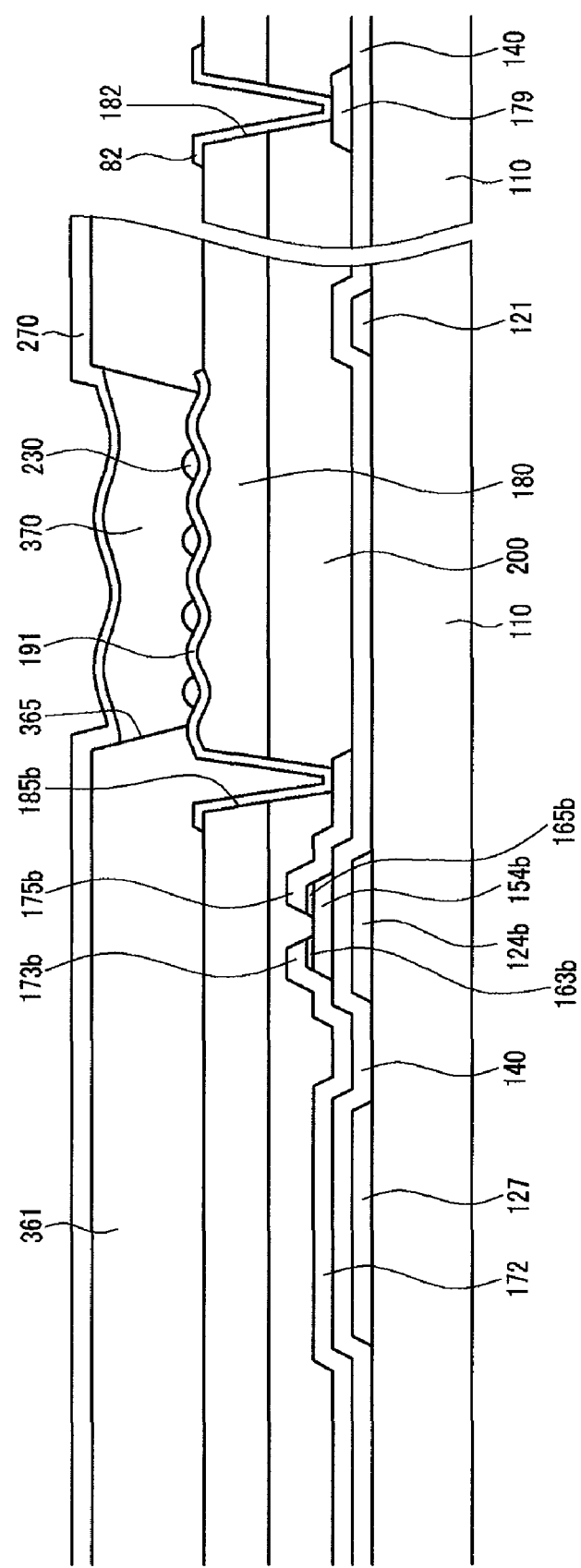
FIG. 24 is a cross-sectional view taken along the line IV-IV of the OLED of FIG. 2 according to yet a different exemplary embodiment of the present invention.

FIG. 24 is a cross-sectional view taken along the line IV-IV of the OLED in FIG. 2 according to yet a different exemplary embodiment of the present invention.

In the present exemplary embodiment, protrusions 230 are provided on the pixel electrode 191. Compared with the embodiment of FIG. 23 in which the first passivation layer 180, which is the lower layer of the pixel electrode 191, is not patterned, in the present exemplary embodiment, the first passivation layer 180 is patterned to have a concavo-convex shape. In this case, the protrusions 230 are positioned on the concave portions of the patterned first passivation layer 180 so that the organic light emitting member 370 can be deposited on the surface to be as flat as possible. With such a structure, when the organic light emitting member 370 is deposited, the chances of the organic light emitting member 370 not being properly deposited on a steep slope portion due to a shadow effect can be reduced.

Figure 25:
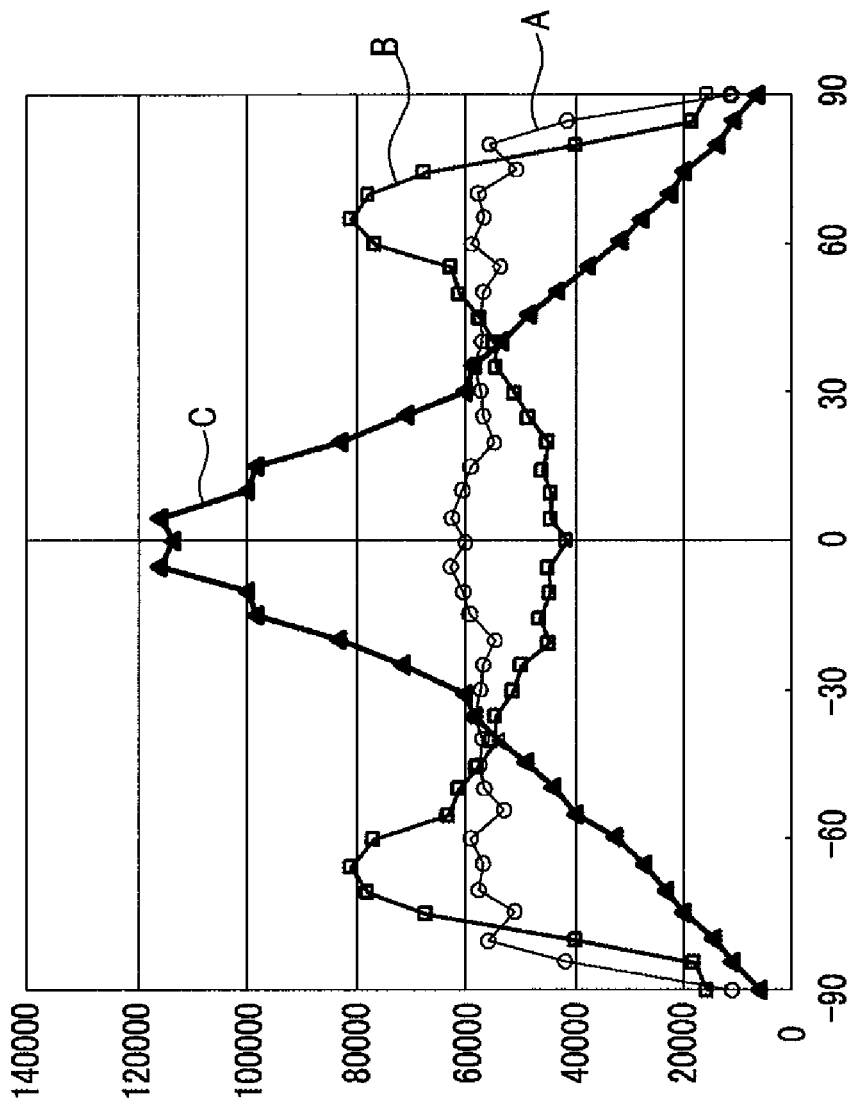
FIG. 25 is a graph comparatively showing light energy generated in the OLED including a concavo-convex structure, a case where there is no difference of refractive index in each layer of the OLED, and a case where there is a difference of refractive index in each layer of the OLED according to one exemplary embodiment of the present invention.

FIG. 25 is a graph comparing the light energy generated in the OLED including a concavo-convex structure, the light energy generated where there is no difference between the refractive indices in each layer of the OLED, and the light energy generated when there is a difference of refractive index in each layer of the OLED according to one exemplary embodiment of the present invention.

In FIG. 25, the horizontal axis refers to an angle measured with reference to an imaginary line that is orthogonal to the central portion of a light emitting part. The (+) angle refers to the right side of the central portion of the light emitting part and the (−) angle refers to the left side of the central portion of the light emitting part. The vertical axis of the graph refers to intensity of light energy, and its unit is a.u. (arbitrary unit).

The line "A" indicates a case where the respective layers of the organic light emitting member 370 do not have a difference in their refractive index, the line "B" indicates a case where the respective layers of the organic light emitting member 370 have a difference in their refractive index, and the line "C" indicates light energy generated in the OLED according to the exemplary embodiment of the present invention.

In the case where the respective layers of the organic light emitting member 370 do not have a difference in their refractive index as indicated by the line "A", light intensity remains relatively constant regardless of the angle from the central portion of the light emitting part. In the case where the respective layers of the organic light emitting member 370 have a difference in their refractive index as indicated by the line "B", maximum light was generated at an angle of about 70° at the left and right sides from the central portion of the light emitting part. In the case of intensity of light generated in the OLED including the concavo-convex structure according to the the lines "A" and "B" was measured in the range of 0 (to 30 (at the left and right sides from the central portion of the light emitting part. In particular, double the intensity of light of that of the lines "A" and "B" was measured in the vicinity of the central portion of the light emitting unit.

In the exemplary embodiment of the present invention, the bottom emission—type of OLED was used as an example. However, this is not a limitation of the present invention, which can also be applied to a top emission-type structure.

The OLED and its manufacturing method according to the exemplary embodiments of the present invention as shown in FIGS. 20 to 24 have the same effect as that of the OLED and its manufacturing method according to the exemplary embodiment of the present invention as shown in FIG. 4.

While this invention has been described in connection with what is presently considered to be practical exemplary embodiments, it is to be understood that the invention is not limited to the disclosed embodiments. On the contrary, the invention is intended to cover various modifications and equivalent arrangements included within the spirit and scope of the appended claims.

As described above, by allowing the pixel electrode to have the concavo-convex surface, the luminescent area can be enlarged with the same opening area as in a planar structure, and the luminous power per unit pixel electrode can be increased. In addition, because the optical interface having the difference of refractive index of 0.2 or greater is formed within the OLED, the light extraction efficiency of the light emitting device can be increased.

What is claimed is:

1. An organic light emitting device comprising:
a substrate;
a first signal line formed on the substrate;
a second signal line formed perpendicularly to the first signal line;
a plurality of thin film transistors formed on the substrate and electrically connected to the first and second signal lines;
a second passivation layer formed on the thin film transistors and having a concavo-convex surface
a first passivation layer formed on the second passivation layer and having a concavo-convex surface;
a first electrode formed on the first passivation layer and having a concavo-convex surface;
a partition formed on the first electrode and having an opening extending to the first electrode;
a light emitting member formed on the first electrode and in the opening; and
a second electrode formed on the light emitting member,
wherein refractive indices of the light emitting member and the first passivation layer are different, and refractive indices of the first passivation layer and the first electrode are different,
wherein at least one of a difference between the refractive indices of light emitting member and the first passivation layer and a difference between the refractive indices of the first passivation layer and the first electrode is 0.2 or greater,
wherein the first electrode has a concavo-convex surface, and
wherein a ratio of height to a bottom length of the concave portion or the convex portion is between about 0.1 and about 1, and
wherein the second passivation layer comprises a polycarbonate-based compound containing silicon nitride or a high refractive index additive.

2. The organic light emitting device of claim 1, further comprising a color filter formed between the substrate and the first electrode.

3. The organic light emitting device of claim 1, wherein a difference between a refractive index of the second passivation layer and that of the first passivation layer is 0.2 or greater.

4. The organic light emitting device of claim 1, further comprising a protrusion formed on the first electrode.

5. The organic light emitting device of claim 4, wherein a difference between a refractive index of the protrusion and that of the light emitting member is 0.2 or greater.

6. The organic light emitting device of claim 5, wherein the protrusion has a hemispherical shape.

7. The organic light emitting device of claim 1, wherein the light emitting member comprises a plurality of emission layers each emitting light of a different wavelength, and light each with different wavelengths are combined to emit white light.

8. An organic light emitting device comprising:
a substrate;
a first signal line formed on the substrate;
a second signal line formed perpendicularly to the first signal line;
a plurality of thin film transistors formed on the substrate and electrically connected to the first and second signal lines;
a first passivation layer formed on the thin film transistors and having a concavo-convex surface;
a first electrode formed on the first passivation layer and having a concavo-convex surface;
a partition formed on the first electrode and having an opening extending to the first electrode;
a light emitting member formed on the first electrode and disposed in the opening;
a second electrode formed on the light emitting member; and
a second passivation layer between the substrate and the first electrode and having a concavo-convex surface;
wherein a ratio of height to bottom length of the concave portion or the convex portion of the first passivation layer is between about 0.1 and about 1,
wherein a difference between a refractive index of the second passivation layer and that of the first passivation layer is 0.2 or greater, and
wherein the second passivation comprises a polycarbonate-based compound containing silicon nitride or a high refractive index additive.

9. The organic light emitting device of claim 8, wherein a difference between a refractive index of the second passivation layer and that of the first passivation layer is 0.2 or greater.

10. The organic light emitting device of claim 8, further comprising a protrusion formed on the first electrode.

11. The organic light emitting device of claim 10, wherein a difference between a refractive index of the protrusion and that of the light emitting member is 0.2 or greater.

12. The organic light emitting device of claim 11, wherein the protrusion has a hemispherical shape.

13. The organic light emitting device of claim 8, wherein the light emitting member comprises a plurality of emission layers each emitting light of a different wavelength, and respective light each with a different wavelength are combined to emit white light.

14. A method for manufacturing an organic light emitting device, comprising:
forming a plurality of signal lines and a plurality of thin film transistors on a substrate;
forming a second passivation layer with a concavo-convex surface on the signal lines and the thin film transistors;
forming a first passivation layer with a concavo-convex surface on the second passivation layer;
forming a first electrode on the first passivation layer;
forming a partition on the first electrode and having an opening extending to the first electrode;
forming a light emitting member on the first electrode in the opening; and
forming a second electrode on the light emitting member;
wherein at least one of a difference between the refractive indices of light emitting member and the first passivation layer and a difference between the refractive indices of the first passivation layer and the first electrode is 0.2 or greater,
wherein the concavo-convex shape of the surface of the first passivation layer is formed at a portion corresponding to the opening,
wherein a ratio of height to bottom length of the concave portion or the convex portion of the first passivation layer is between about 0.1 and about 1, and
wherein the second passivation layer comprises a polycarbonate-based compound containing silicon nitride or a high refractive index additive.

15. The method of claim 14, wherein the forming of the second passivation layer comprises:
coating a photosensitive organic layer;

exposing the photosensitive organic film to light through a slit mask; and developing the photosensitive organic layer.

16. The method of claim 14, further comprising forming a color filter between the substrate and the first electrode.

17. The method of claim 14, further comprising forming a protrusion on the first electrode.

18. The method of claim 17, wherein a difference between a refractive index of the protrusion and that of the light emitting member is 0.2 or greater.

19. The method of claim 18, wherein the protrusion has a hemispherical shape.

* * * * *